(12) United States Patent
Harada et al.

(10) Patent No.: US 8,513,676 B2
(45) Date of Patent: Aug. 20, 2013

(54) SEMICONDUCTOR DEVICE AND METHOD FOR MANUFACTURING SAME

(75) Inventors: Shin Harada, Osaka (JP); Toru Hiyoshi, Osaka (JP); Keiji Wada, Osaka (JP); Takeyoshi Masuda, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/512,459

(22) PCT Filed: Dec. 17, 2010

(86) PCT No.: PCT/JP2010/072769
§ 371 (c)(1),
(2), (4) Date: May 29, 2012

(87) PCT Pub. No.: WO2011/118101
PCT Pub. Date: Sep. 29, 2011

(65) Prior Publication Data
US 2012/0235165 A1    Sep. 20, 2012

(30) Foreign Application Priority Data
Mar. 23, 2010 (JP) .................................. 2010-066196

(51) Int. Cl.
*H01L 29/38* (2006.01)

(52) U.S. Cl.
USPC ............. 257/77; 257/285; 257/610; 257/627; 257/628

(58) Field of Classification Search
USPC .................. 257/285, 610, 627, 628
See application file for complete search history.

(56) References Cited

U.S. PATENT DOCUMENTS

| | | | |
|---|---|---|---|
| 6,734,461 B1 | 5/2004 | Shiomi et al. | |
| 7,262,465 B2 * | 8/2007 | Hatada et al. | 257/347 |
| 7,381,993 B2 * | 6/2008 | Uchida et al. | 257/77 |
| 7,407,837 B2 * | 8/2008 | Tsuji | 438/137 |
| 2005/0191536 A1 * | 9/2005 | Warrier et al. | 429/34 |
| 2006/0220026 A1 * | 10/2006 | Uchida et al. | 257/77 |
| 2009/0011598 A1 | 1/2009 | Nagaya et al. | |
| 2011/0175110 A1 | 7/2011 | Wada et al. | |
| 2011/0180813 A1 | 7/2011 | Harada et al. | |
| 2012/0181550 A1 * | 7/2012 | Fujibayashi et al. | 257/77 |

FOREIGN PATENT DOCUMENTS

| | | |
|---|---|---|
| JP | 7-97299 | 4/1995 |
| JP | 2001-2499 | 1/2001 |
| JP | 2006-328455 | 12/2006 |
| JP | 2009/16602 | 1/2009 |
| JP | 2009-105127 | 5/2009 |
| JP | 2009-158933 | 7/2009 |
| JP | 2009-176804 | 8/2009 |
| JP | 2009-256159 | 11/2009 |
| WO | 01/18872 | 3/2001 |
| WO | 2011/110253 | 9/2010 |
| WO | 2010/116886 | 10/2010 |

* cited by examiner

*Primary Examiner* — Eugene Lee
(74) *Attorney, Agent, or Firm* — Drinker Biddle & Reath LLP

(57) ABSTRACT

A semiconductor device includes: a substrate made of silicon carbide and having a main surface having an off angle of not less than −3° and not more than +5° relative to a (0-33-8) plane in a <01-10> direction; a p type layer made of silicon carbide and formed on the main surface of the substrate by means of epitaxial growth; and an oxide film formed in contact with a surface of the p type layer. A maximum value of nitrogen atom concentration is $1 \times 10^{21}$ cm$^{-3}$ or greater in a region within 10 nm from an interface between the p type layer and the oxide film.

20 Claims, 19 Drawing Sheets

PEAK CONCENTRATION OF NITROGEN (cm$^{-3}$)

TOTAL PEAK CONCENTRATION OF NITROGEN AND HYDROGEN (cm$^{-3}$)

SEMICONDUCTOR DEVICE AND METHOD FOR MANUFACTURING SAME

TECHNICAL FIELD

The present invention relates to a semiconductor device and a method for manufacturing the semiconductor device, more particularly, a semiconductor device exhibiting an excellent electric characteristic and a method for manufacturing such a semiconductor device.

BACKGROUND ART

Conventionally, a semiconductor device employing silicon carbide (SiC) has been known (for example, see international publication WO01/018872 (hereinafter, referred to as "Patent Literature 1")). In Patent Literature 1, a SiC substrate of 4H polytype having a plane orientation of substantially {03-38} is used to form a MOS field effect transistor (MOSFET; Metal Oxide Semiconductor Field Effect Transistor) serving as the semiconductor device. In this MOSFET, a gate oxide film is formed by means of dry oxidation. Patent Literature 1 describes that such a MOSFET can achieve a large channel mobility (approximately 100 cm²/Vs).

CITATION LIST

Patent Literature

PTL 1: International Publication WO01/018872

SUMMARY OF INVENTION

Technical Problem

However, as a result of inspection by the inventors, it has been found that channel mobility may not become sufficiently large in the above-described MOSFET. To stably exhibit the excellent characteristic of the semiconductor device employing SiC, it is required to realize a large channel mobility reproducibly.

The present invention has been made to solve the foregoing problem, and has its object to provide a semiconductor device having excellent electric characteristic such as channel mobility, as well as a method for manufacturing the semiconductor device.

Solution to Problem

As a result of diligent study on a cause of reduced channel mobility, the inventors have completed the present invention in order to reproducibly achieve a large channel mobility in a semiconductor device which employs SiC as described above. Specifically, in the semiconductor device, a gate oxide film is formed by means of dry oxidation, which presumably introduces a multiplicity of traps (interface states) into an interface between the gate oxide film and a SiC semiconductor film disposed below the gate oxide film. Existence of such interface states can be a factor that leads to the above-described reduced channel mobility. This is also presumed from a fact that the threshold voltage of the MOSFET is drastically higher than its theoretical value. In view of the above, the inventors have sought for a method for reducing such an influence of the interface states. As a result, it has been found that the channel mobility can be increased by increasing the nitrogen atom concentration or the hydrogen atom concentration in the vicinity of the interface. This is presumably because the influence of the interface states can be suppressed by increasing nitrogen atom concentration or hydrogen atom concentration in the vicinity of the interface.

Further, when a semiconductor layer is formed through epitaxial growth on a main surface, which is close to a {03-38} plane, of a substrate made of silicon carbide and an insulating film (for example, gate oxide film) is formed on a surface of the semiconductor layer to obtain a semiconductor device, carrier mobility is improved in the semiconductor layer in the vicinity of an interface between the semiconductor layer and the insulating film. Further, it has been found that the carrier mobility is drastically increased by employing a structure in which the semiconductor layer and the insulating film are formed particularly on a plane close to the (0-33-8) plane, which is a plane of the C (carbon) plane side of the {03-38} plane.

Based on the above-described findings, a semiconductor device according to one aspect of the present invention includes: a substrate made of silicon carbide and having a main surface having an off angle of not less than −3° and not more than +5° relative to a (0-33-8) plane in a <01-10> direction; a semiconductor layer made of silicon carbide and formed on the main surface of the substrate by means of epitaxial growth; and an insulating film formed in contact with a surface of the semiconductor layer. A maximum value of nitrogen atom concentration is $1 \times 10^{21}$ cm$^{-3}$ or greater in a region within 10 nm from an interface between the semiconductor layer and the insulating film.

Further, a semiconductor device according to another aspect of the present invention includes: a substrate made of silicon carbide and having a main surface having an off angle of not less than −3° and not more than +5° relative to a (0-33-8) plane in a <01-10> direction; a semiconductor layer made of silicon carbide and formed on the main surface of the substrate by means of epitaxial growth; and an insulating film formed in contact with a surface of the semiconductor layer. A maximum value of hydrogen atom concentration is $1 \times 10^{21}$ cm$^{-3}$ or greater in a region within 10 nm from an interface between the semiconductor layer and the insulating film.

Further, a semiconductor device according to still another aspect of the present invention includes: a substrate made of silicon carbide and having a main surface having an off angle of not less than −3° and not more than +5° relative to a (0-33-8) plane in a <01-10> direction; a semiconductor layer made of silicon carbide and formed on the main surface of the substrate by means of epitaxial growth; and an insulating film formed in contact with a surface of the semiconductor layer. A maximum value of total concentration of nitrogen atoms and hydrogen atoms is $1 \times 10^{21}$ cm$^{-3}$ or greater in a region within 10 nm from an interface between the semiconductor layer and the insulating film.

In this way, carrier mobility (for example, channel mobility in the case where the insulating film is used as a gate insulating film) can be made larger in the semiconductor layer in the vicinity of the interface between the insulating film and the semiconductor layer, than that in the case where the nitrogen atoms or the hydrogen atoms are not contained in the vicinity of the interface, thereby achieving lower on-resistance than that of a conventional semiconductor device employing silicon. Further, with the main surface of the substrate corresponding to a plane close to the (0-33-8) plane, the carrier mobility can be further increased to achieve further reduction of the on-resistance. Thus, according to the semiconductor device of the present invention, there can be obtained a semiconductor device excellent in electric characteristic and exhibiting a sufficiently large carrier mobility (channel mobility).

Here, in the present application, the (0001) plane of single-crystal silicon carbide of hexagonal crystal is defined as the silicon plane whereas the (000-1) plane is defined as the carbon plane. Meanwhile, the "off angle relative to the (0-33-8) plane in the <01-10> direction" refers to an angle formed by the orthogonal projection of a normal line of the main surface to a flat plane defined by the <000-1> direction and the <01-10> direction serving as a reference for the off orientation, and a normal line of the (0-33-8) plane. The sign of a positive value corresponds to a case where the orthogonal projection approaches in parallel with the <01-10> direction, whereas the sign of a negative value corresponds to a case where the orthogonal projection approaches in parallel with the <000-1> direction. Further, the expression "the main surface having an off angle of not less than −3° and not more than +5° relative to the (0-33-8) plane in the <01-10> direction" indicates that the main surface corresponds to a plane, at the carbon plane side, which satisfies the above-described conditions in the silicon carbide crystal. It should be noted that in the present application, the (0-33-8) plane includes an equivalent plane, at the carbon plane side, which is expressed in a different manner due to determination of an axis for defining a crystal plane, and does not include a plane at the silicon plane side.

In the semiconductor device according to the above-described one aspect, hydrogen atoms may be contained in the region within 10 nm from the interface between the semiconductor layer and the insulating film.

Further, in the semiconductor device according to the above-described another aspect, nitrogen atoms may be contained in the region within 10 nm from the interface between the semiconductor layer and the insulating film.

By providing both the nitrogen atoms and the hydrogen atoms in the vicinity of the interface between the semiconductor layer and the insulating film in this way, the carrier mobility can be increased more securely.

In each of the semiconductor devices, an interface state density is preferably smaller than $1 \times 10^{12}$ cm$^{-2}$eV$^{-1}$ in a level smaller than a conduction band by 0.1 eV. Accordingly, the carrier mobility can be increased more securely.

In each of the semiconductor devices, the semiconductor layer may be made of silicon carbide of 4H type. In this case, when photoluminescence measurement is performed for the semiconductor layer at a room temperature (approximately 300K), a ratio of strength of a peak appearing in a wavelength of around 500 nm to strength of a peak appearing in a wavelength of around 390 nm is preferably 0.1 or smaller.

According to review by the inventors, in the case where the semiconductor layer made of silicon carbide of 4H type (4H-SiC) is employed, it has been found that the on-resistance and the interface state density in the semiconductor device can be reduced by decreasing the peak appearing in the wavelength of around 500 nm in photoluminescence measurement under the room temperature. More specifically, it has been found that the peak in the wavelength of around 500 nm appears due to existence of certain stacking faults. Such stacking faults corresponding to this peak lead to increased on-resistance of the semiconductor device and increased interface state density in a MOS (Metal-Oxide-Semiconductor) structure. On the other hand, the peak appearing in the wavelength of around 390 nm corresponds to interband luminescence of the 4H-SiC. With the ratio of the peak strengths being not more than 0.1, the on-resistance and the interface state density in the semiconductor device can be reduced. Further, with the ratio of the peak strengths being not more than 0.01, the on-resistance and the interface state density in the semiconductor device can be further reduced. Here, the state in which the ratio of the peak strengths is not more than 0.1 or not more than 0.01 encompasses a case where the ratio of the peak strengths is 0. In other words, the peak in the wavelength of around 500 nm may not be appear. It is the most preferable that the peak in the wavelength of around 500 nm does not appear.

A method for manufacturing a semiconductor device in one aspect of the present invention includes the steps of: preparing a substrate made of silicon carbide and having a main surface having an off angle of not less than −3° and not more than +5° relative to a (0-33-8) plane in a <01-10> direction; forming a semiconductor layer on the main surface of the substrate by means of epitaxial growth; forming an insulating film in contact with a surface of the semiconductor layer; and adjusting nitrogen atom concentration such that a maximum value of the nitrogen atom concentration becomes $1 \times 10^{21}$ cm$^{-3}$ or greater in a region within 10 nm from an interface between the semiconductor layer and the insulating film.

Further, a method for manufacturing a semiconductor device in another aspect of the present invention includes the steps of: preparing a substrate made of silicon carbide and having a main surface having an off angle of not less than −3° and not more than +5° relative to a (0-33-8) plane in a <01-10> direction; forming a semiconductor layer on the main surface of the substrate by means of epitaxial growth; forming an insulating film in contact with a surface of the semiconductor layer; and adjusting hydrogen atom concentration such that a maximum value of the hydrogen atom concentration becomes $1 \times 10^{21}$ cm$^{-3}$ or greater in a region within 10 nm from an interface between the semiconductor layer and the insulating film.

Further, a method for manufacturing a semiconductor device in still another aspect of the present invention includes the steps of: preparing a substrate made of silicon carbide and having a main surface having an off angle of not less than −3° and not more than +5° relative to a (0-33-8) plane in a <01-10> direction; forming a semiconductor layer on the main surface of the substrate by means of epitaxial growth; forming an insulating film in contact with a surface of the semiconductor layer; and adjusting total concentration of nitrogen atoms and hydrogen atoms such that a maximum value of the total concentration becomes $1 \times 10^{21}$ cm$^{-3}$ or greater in a region within 10 nm from an interface between the semiconductor layer and the insulating film.

In this way, each of the semiconductor devices according to the present invention can be readily manufactured which has increased carrier mobility (channel mobility).

The method for manufacturing the semiconductor device in the above-described one aspect may further include the step of providing hydrogen atoms in the region within 10 nm from the interface between the semiconductor layer and the insulating film. By providing both the nitrogen atoms and the hydrogen atoms in the vicinity of the interface between the semiconductor layer and the insulating film in this way, the carrier mobility can be increased more securely.

In the method for manufacturing the semiconductor device in the above-described one aspect, the step of providing the hydrogen atoms may include the step of heating the substrate having the insulating film formed thereon, using gas containing hydrogen atoms as atmospheric gas.

Further, in the method for manufacturing the semiconductor device in the above-described one aspect, the step of adjusting the nitrogen atom concentration may include the step of heating the substrate having the insulating film formed thereon, using gas containing nitrogen atoms as atmospheric gas.

In this way, the hydrogen atoms and the nitrogen atoms can be readily introduced into the vicinity of the interface between the semiconductor layer and the insulating film.

In the method for manufacturing the semiconductor device in the above-described one aspect, the step of adjusting the nitrogen atom concentration may include the step of heating the substrate using an inert gas as the atmospheric gas after the step of heating using the gas containing the nitrogen atoms as the atmospheric gas.

Accordingly, the nitrogen atoms introduced in the vicinity of the interface between the semiconductor layer and the insulating film can more securely exhibit the effect of reducing the interface states.

The method for manufacturing the semiconductor device in the above-described another aspect may further include the step of providing nitrogen atoms in the region within 10 nm from the interface between the semiconductor layer and the insulating film. By providing both the nitrogen atoms and the hydrogen atoms in the vicinity of the interface between the semiconductor layer and the insulating film in this way, the carrier mobility can be increased more securely.

In the method for manufacturing the semiconductor device in the above-described another aspect, the step of providing the nitrogen atoms may include the step of heating the substrate having the insulating film formed thereon, using gas containing nitrogen atoms as atmospheric gas.

Further, in the method for manufacturing the semiconductor device in the above-described another aspect, the step of adjusting the hydrogen atom concentration may include the step of heating the substrate having the insulating film formed thereon, using gas containing hydrogen atoms as the atmospheric gas.

In this way, the hydrogen atoms and the nitrogen atoms can be readily introduced into the vicinity of the interface between the semiconductor layer and the insulating film.

In the method for manufacturing the semiconductor device in the above-described another aspect, the step of adjusting the hydrogen atom concentration may include the step of heating the substrate using an inert gas as the atmospheric gas after the step of heating using the gas containing the hydrogen atoms as the atmospheric gas.

Accordingly, the hydrogen atoms introduced in the vicinity of the interface between the semiconductor layer and the insulating film can more securely exhibit the effect of reducing the interface states.

In the method for manufacturing the semiconductor device in each of the above-described one aspect and another aspect, the gas containing the hydrogen atoms may be water vapor or water vapor-containing oxygen. In this way, the hydrogen atoms can be readily introduced into the vicinity of the interface between the semiconductor layer and the insulating film.

In the method for manufacturing the semiconductor device, the step of preparing the substrate may include the steps of: obtaining the substrate from a source material crystal made of silicon carbide of 4H type; and removing a processing damage layer formed in a region including the other main surface of the substrate thus obtained, the other main surface being opposite to the main surface of the substrate.

As described above, the inventors have found that in the case where the semiconductor layer made of 4H-SiC is employed, the on-resistance and the interface state density in the semiconductor device can be reduced by reducing the peak strength in the wavelength of around 500 nm in the photoluminescence measurement under the room temperature. Further, as a result of more detailed review by the inventors, it has been found that in the case where the substrate is obtained from the source material crystal made of 4H-SiC and the semiconductor layer made of 4H-SiC is formed through epitaxial growth, the above-described peak strength is increased with the following mechanism to result in increased on-resistance in the semiconductor device.

Specifically, when obtaining the substrate from the source material crystal, processing damage layers are formed in the vicinity of the main surfaces of the substrate. Of the two main surfaces of the substrate, the main surface (the main surface at the semiconductor layer side) on which the semiconductor layer is to be formed by means of epitaxial growth is thereafter smoothed with high precision by means of polishing or the like. As a result, the processing damage layer in the main surface at the semiconductor layer side is removed. In contrast, the processing damage layer remains in the vicinity of the main surface (main surface at the backside surface side) opposite to the side at which the semiconductor layer is formed. On the main surface at the semiconductor side, the semiconductor layer, the insulating film (oxide film), and the like are formed to fabricate the semiconductor device. In the process of manufacturing the semiconductor device, there are performed the step of heating to a temperature range of approximately 1000° C. to approximately 1200° C. such as thermal oxidation treatment, and the step of heating to a temperature range higher than the foregoing temperature range. Here, when the impurity concentration (for example, nitrogen concentration) is high in the substrate in order to reduce the resistivity of the substrate, stacking faults are generated from the processing damage layer remaining in the vicinity of the main surface at the backside surface side and grow in the substrate.

On this occasion, the stacking faults grow in a <11-20> direction. Hence, when a general main surface close to a {0001} plane is employed as the main surface of the substrate for example, the stacking faults grow from the processing damage layer along the main surface at the backside surface. Hence, the stacking faults do not reach the main surface at the semiconductor layer side. Thus, the stacking faults are not propagated to the semiconductor layer formed on the main surface at the semiconductor layer side. However, when the main surface of the substrate at the semiconductor layer side corresponds to a plane close to the (0-33-8) plane as that of the semiconductor device of the present invention, the stacking faults grow from the processing damage layer to move away relative to the main surface at the backside surface side. Accordingly, the stacking faults reach the main surface at the semiconductor layer side. As a result, the stacking faults are propagated to the semiconductor layer formed on the main surface at the semiconductor layer side to result in strong peak strength in the wavelength of around 500 nm in the above-described photoluminescence measurement and result in increased on-resistance and interface state density in the semiconductor device.

To address this, as described above, the step of preparing the substrate includes the step of removing the processing damage layer, whereby the propagation of the stacking faults to the semiconductor layer is suppressed. Accordingly, the on-resistance and the interface state density in the semiconductor device can be reduced.

Preferably in the method for manufacturing the semiconductor device, in the step of obtaining the substrate, the substrate is obtained by slicing the source material crystal, and in the step of removing the processing damage layer, the processing damage layer formed in the substrate by slicing the source material crystal is removed.

By slicing the source material crystal, the substrate can be readily obtained. Then, the processing damage layer formed in the substrate due to the slicing is removed, thereby suppressing the propagation of the stacking faults to the semiconductor layer. Accordingly, the on-resistance and the interface state density in the semiconductor device can be reduced.

In the method for manufacturing the semiconductor device, in the step of removing the processing damage layer, the processing damage layer may be removed by means of fused KOH etching. Further, in the method for manufacturing the semiconductor device, in the step of removing the processing damage layer, the processing damage layer may be removed by means of dry etching. Further, in the method for manufacturing the semiconductor device, in the step of removing the processing damage layer, the processing damage layer may be removed by means of thermal etching. Further, in the method for manufacturing the semiconductor device, in the step of removing the processing damage layer, the processing damage layer may be removed by means of polishing. By means of the fused KOH etching, dry etching, thermal etching, polishing, or the like, the processing damage layer can be readily removed.

Advantageous Effects of Invention

As apparent from the description above, according to the semiconductor device and the method for manufacturing the semiconductor device in the present invention, there can be provided a semiconductor device excellent in electric characteristic such as channel mobility as well as a method for manufacturing such a semiconductor device.

DESCRIPTION OF EMBODIMENTS

Figure 1:
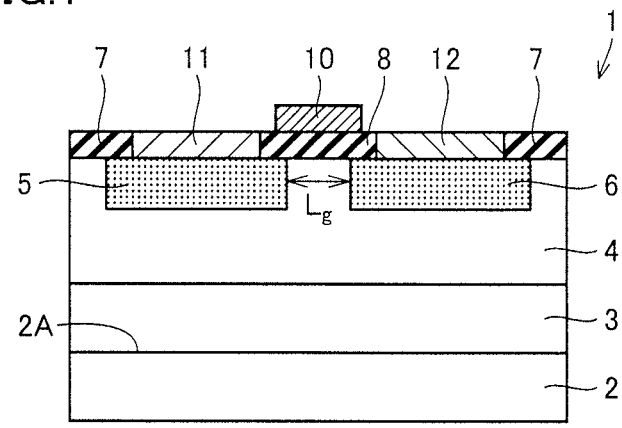
FIG. 1 is a schematic cross sectional view showing a structure of a semiconductor device.

The following describes embodiments of the present invention with reference to figures. It should be noted that in the below-mentioned figures, the same or corresponding portions are given the same reference characters and are not described repeatedly.

First Embodiment

First, a first embodiment, which is one embodiment of the present invention, will be described. A semiconductor device 1 shown in FIG. 1 is a MOSFET of lateral type (Metal-Oxide-Semiconductor Field Effect Transistor) serving as the semiconductor device, and includes: a substrate 2 made of silicon carbide (SiC) of 4H type; an epitaxial layer 3 formed on this substrate 2 and made of silicon carbide; a p type layer 4 formed on this epitaxial layer 3 and made of silicon carbide; $n^+$ regions 5, 6 formed, with a space therebetween, in regions including the surface of p type layer 4; an oxide film 8 located above a channel region between $n^+$ regions 5, 6 and serving as a gate insulating film; a gate electrode 10 formed on this oxide film 8; and a source electrode 11 and a drain electrode 12 respectively formed on $n^+$ regions 5, 6. Substrate 2 is a substrate having a main surface 2A located at the side of epitaxial layer 3 serving as the semiconductor layer and corresponding to a (0-33-8) plane, which has an off angle of approximately 53° relative to a plane orientation of {0001}. Substrate 2 includes an n type impurity (impurity allowing substrate 2 to have n type conductivity such as nitrogen).

Epitaxial layer 3 formed on substrate 2 and made of silicon carbide is an undoped layer. P type layer 4 provided on this epitaxial layer 3 contains a p type impurity (impurity allowing p type layer 4 to have p type conductivity such as aluminum). Further, an n type impurity is implanted in each of $n^+$ regions 5, 6. To cover p type layer 4 and $n^+$ regions 5, 6, oxide films 7, 8 are formed. Oxide films 7, 8 have openings at regions above $n^+$ regions 5, 6. In the openings, source electrode 11 and drain electrode 12 are formed which are respectively electrically connected to $n^+$ regions 5, 6. Gate electrode 10 is disposed on oxide film 8 serving as a gate insulating film. A distance between $n^+$ regions 5, 6, i.e., a channel length $L_g$ can be set at, for example, approximately 100 μm. Further, a channel width can be, for example, twice as large as channel length $L_g$ (approximately 200 μm).

In the semiconductor device shown in FIG. 1, the maximum value of the nitrogen atom concentration is equal to or greater than $1 \times 10^{21} cm^{-3}$ in a region within 10 nm from an interface between oxide film 8 and p type layer 4 serving as the semiconductor layer. As a result, the channel region having channel length $L_g$ (the region between $n^+$ regions 5, 6 in p type layer 4) can be provided with mobility (channel mobility) of a sufficiently large value.

This is presumably due to the following reason. That is, in the case where oxide film 8 is formed by means of thermal oxidation or the like, a multiplicity of interface states are formed at the interface between oxide film 8 and p type layer 4 serving as the semiconductor layer. Accordingly, without any modification, channel mobility in the channel region will be drastically decreased as compared with its theoretical value. To address this problem, nitrogen atoms are introduced between the interface region between oxide film 8 and p type layer 4 as described above, thereby achieving improved channel mobility while reducing the influence of the above-described interface states.

Further, in semiconductor device 1 in the present embodiment, main surface 2A of substrate 2 at the epitaxial layer 3 side corresponds to the (0-33-8) plane. Accordingly, p type layer 4, which is formed by means of epitaxial growth on main surface 2A and impurity implantation, is provided with a main surface opposite to substrate 2 and corresponding to the (0-33-8) plane. As a result, the channel region (the region including the interface with oxide film 8 in $n^+$ regions 5, 6 formed in p type layer 4) can be provided with a larger carrier mobility (channel mobility).

Figure 2:
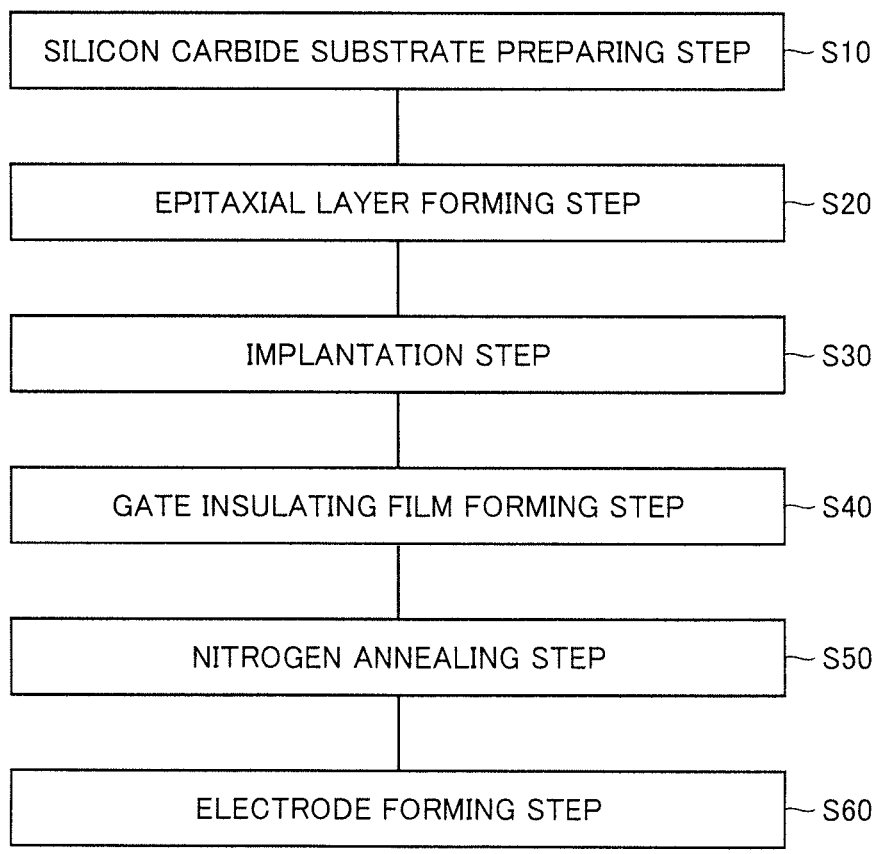
FIG. 2 is a flowchart for illustrating a method for manufacturing the semiconductor device shown in FIG. 1.

Referring to FIG. 2-FIG. 7, the following describes a method for manufacturing the semiconductor device in the first embodiment. First, as shown in FIG. 2, a silicon carbide substrate preparing step (S10) is performed. Prepared in this step as substrate 2 is a silicon carbide substrate having n type conductivity and having main surface 2A corresponding to the plane with a plane orientation of (0-33-8). Such a substrate can be obtained by means of, for example, a technique of cutting an ingot (source material crystal) having a main surface corresponding to the (0001) plane, to obtain the substrate having main surface 2A exposed and corresponding to the (0-33-8).

Figure 3:
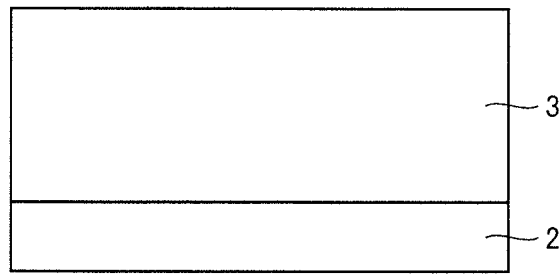
FIG. 3 is a schematic cross sectional view for illustrating a step of the manufacturing method shown in FIG. 2.

Next, an epitaxial layer forming step (S20) is performed. Specifically, as shown in FIG. 3, undoped silicon carbide epitaxial layer 3 is formed on substrate 2 by means of epitaxial growth.

Figure 4:
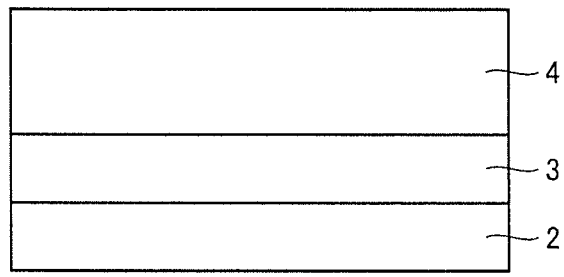
FIG. 4 is a schematic cross sectional view for illustrating a step of the manufacturing method shown in FIG. 2.
Figure 5:
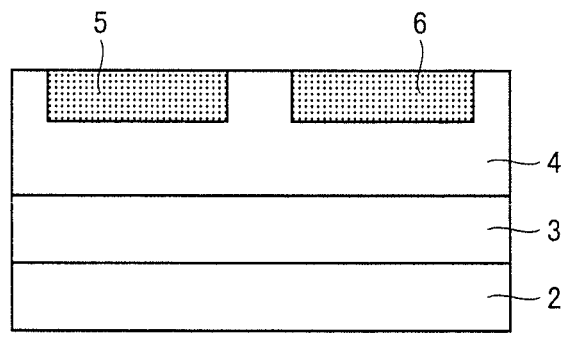
FIG. 5 is a schematic cross sectional view for illustrating a step of the manufacturing method shown in FIG. 2.

Next, an implantation step (S30) is performed. Specifically, first, a p type impurity (for example, aluminum (Al)) is implanted into epitaxial layer 3 to form p type layer 4 as shown in FIG. 4. Next, an n type impurity is implanted thereinto to form $n^+$ regions 5, 6 as shown in FIG. 5. An exemplary, usable n type impurity is phosphorus (P). Any well-known method can be used to form $n^+$ regions 5, 6. An example of the method is as follows. That is, an oxide film is formed to cover the upper surface of p type layer 4 and is then provided, by means of photolithography and etching, with openings having the same planar shape pattern as that of the regions in which $n^+$ regions 5, 6 are to be formed. Then, the n type impurity is implanted using, as a mask, the oxide film thus provided with this pattern. In this way, $n^+$ regions 5, 6 described above can be formed.

Thereafter, activation annealing treatment is performed to activate the impurity thus implanted. This activation annealing treatment may be performed under conditions that, for example, heating temperature is set at 1700° C. and heating time is set at 30 minutes.

Figure 6:
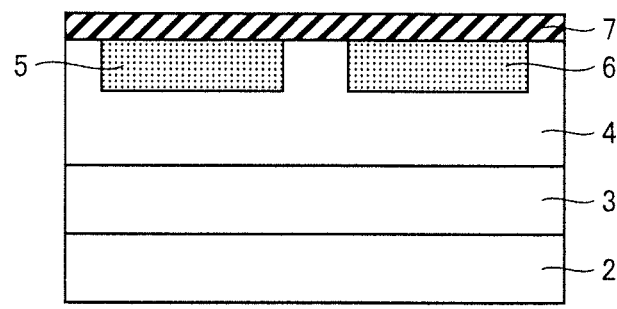
FIG. 6 is a schematic cross sectional view for illustrating a step of the manufacturing method shown in FIG. 2.

Next, a gate insulating film forming step (S40) is performed as shown in FIG. 2. Specifically, oxide film 7 serving as the gate insulating film is formed as shown in FIG. 6 by oxidizing the upper surfaces of p type layer 4 and $n^+$ regions 5, 6. Oxide film 7 can have a thickness of, for example, 40 nm.

Next, a nitrogen annealing step (S50) is performed as shown in FIG. 2. Specifically, heat treatment is performed using nitrogen monoxide (NO) gas as atmospheric gas. This heat treatment can be performed under conditions that, for example, heating temperature is set at 1100° C. and heating time is set at 1 hour. As a result, nitrogen atoms can be introduced into the interface region between oxide film 7 and each of p type layer 4 and $n^+$ regions 5, 6. Further, in this nitrogen annealing step, an annealing step using an inert gas may be performed after the annealing step using the atmospheric gas containing above-described nitrogen atoms. An example of the annealing step using an inert gas is an annealing step using argon (Ar) gas as the atmospheric gas.

Figure 7:
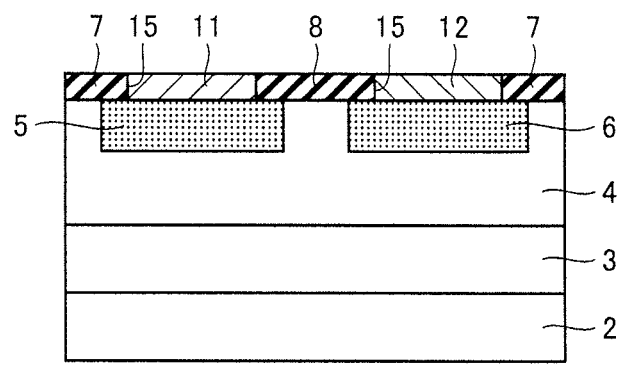
FIG. 7 is a schematic cross sectional view for illustrating a step of the manufacturing method shown in FIG. 2.

Next, as shown in FIG. 2, an electrode forming step (S60) is performed. Specifically, a resist film having a pattern is formed on oxide film 7 by means of the photolithography method. By removing portions of oxide film 7 using this resist film as a mask, openings 15 are formed in the regions located above n⁺ regions 5, 6. In each of openings 15, as shown in FIG. 7, a conductor film to be formed into each of source electrode 11 and drain electrode 12 are formed. The conductor film is formed with the above-described resist film remaining thereon. Thereafter, a portion of the conductor film above oxide film 7 is removed (lifted off) together with the resist film by removing the resist film, thereby forming source electrode 11 and drain electrode 12 as shown in FIG. 7. On this occasion, oxide film 8 between source electrode 11 and drain electrode 12 (the portion of oxide film 7 shown in FIG. 6) is formed into the gate insulating film of the semiconductor device.

Thereafter, gate electrode 10 (see FIG. 1) is formed on oxide film 8 serving as the gate insulating film. As a method of forming gate electrode 10, the following method can be used. For example, a resist film having an opening pattern at a region above oxide film 8 is formed in advance, and a conductor film to constitute the gate electrode is formed to cover the entire surface of the resist film. Then, by removing the resist film, portions of the conductor film other than the portion to be formed into the gate electrode are removed (lifted off). As a result, as shown in FIG. 1, gate electrode 10 is formed. In this way, semiconductor device 1 shown in FIG. 1 can be obtained.

Second Embodiment

Figure 8:
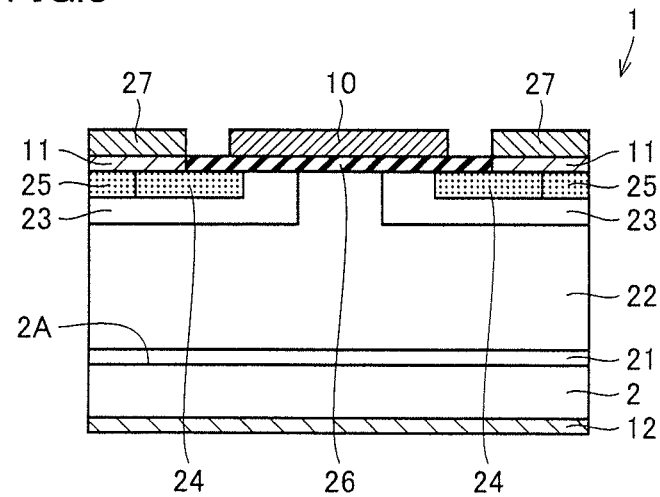
FIG. 8 is a schematic cross sectional view showing a structure of a semiconductor device in a second embodiment.

Referring to FIG. 8, the following describes a semiconductor device in a second embodiment. Semiconductor device 1 in the present embodiment is a vertical type DiMOSFET (Double Implanted MOSFET), and includes: a substrate 2, a buffer layer 21, a breakdown voltage holding layer 22, p regions 23, n⁺ regions 24, p⁺ regions 25, an oxide film 26, source electrodes 11, upper source electrodes 27, a gate electrode 10, and a drain electrode 12 formed on the backside surface of substrate 2. Specifically, buffer layer 21, which is made of silicon carbide, is formed on main surface 2A of substrate 2 made of silicon carbide of n type conductivity. Buffer layer 21 has n type conductivity, and has a thickness of, for example, 0.5 μm. Further, buffer layer 21 can be adapted to contain an n type impurity at a concentration of, for example, $5\times10^{17}$ cm⁻³. Formed on buffer layer 21 is breakdown voltage holding layer 22. Breakdown voltage holding layer 22 is made of silicon carbide of n type conductivity, and has a thickness of 10 μm, for example. Further, breakdown voltage holding layer 22 contains an n type impurity at a concentration of, for example, $5\times10^{15}$ cm⁻³.

At a region including the main surface of breakdown voltage holding layer 22 opposite to substrate 2, p regions 23 of p type conductivity are formed with a space interposed therebetween. In each of p regions 23, n⁺ region 24 is formed at a region including the main surface of p region 23. Further, at a location adjacent to n⁺ region 24, a p⁺ region 25 is formed. Oxide film 26 is formed to extend on n⁺ region 24 in one p region 23, p region 23, an exposed portion of breakdown voltage holding layer 22 between the two p regions 23, the other p region 23, and n⁺ region 24 in the other p region 23. On oxide film 26, gate electrode 10 is formed. Further, source electrodes 11 are formed on and in contact with n⁺ regions 24 and p⁺ regions 25. On source electrodes 11, upper source electrodes 27 are formed. Moreover, drain electrode 12 is formed on the main surface (backside surface) of substrate 2 opposite to its main surface on which buffer layer 21 is formed.

Here, the maximum value of the nitrogen atom concentration is $1\times10^{21}$ cm⁻³ or greater in a region within 10 nm from the interface between oxide film 26 and the semiconductor layer, i.e., each of n⁺ regions 24, p⁺ regions 25, p regions 23, and breakdown voltage holding layer 22. Accordingly, as with semiconductor device 1 shown in FIG. 1, mobility can be improved particularly in the channel region below oxide film 26 (the portion of each p region 23 making contact with oxide film 26 and located between n⁺ region 24 and breakdown voltage holding layer 22).

Further, in semiconductor device 1 in the present embodiment, main surface 2A of substrate 2 at the buffer layer 21 side corresponds to the (0-33-8) plane. Hence, each of p regions 23, which are formed by means of epitaxial growth on main surface 2A and impurity implantation, has a main surface opposite to substrate 2 and corresponding to the (0-33-8) plane. As a result, carrier mobility (channel mobility) in the channel region can be further larger.

The following describes a method for manufacturing semiconductor device 1 shown in FIG. 8, with reference to FIG. 9-FIG. 12. First, as with the method for manufacturing the semiconductor device as shown in FIG. 2, silicon carbide substrate preparing step (S10) is performed. In this step, as with the method for manufacturing the semiconductor device in the first embodiment, there is prepared substrate 2 (see FIG. 9) made of silicon carbide and having its main surface corresponding to the (0-33-8) plane. As substrate 2 (see FIG. 9), a substrate may be employed which has n type conductivity and has a substrate resistance of 0.02 Ωcm.

Figure 9:
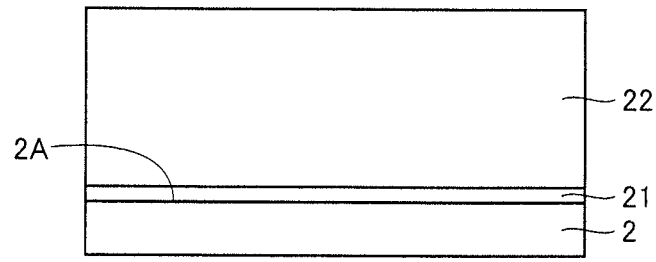
FIG. 9 is a schematic cross sectional view for illustrating a method for manufacturing the semiconductor device shown in FIG. 8.

Next, epitaxial layer forming step (S20) is performed. Specifically, buffer layer 21 is formed on main surface 2A of substrate 2. As the buffer layer, an epitaxial layer is formed which is made of silicon carbide of n type conductivity and has a thickness of 0.5 μm, for example. Buffer layer 21 has a conductive impurity at a concentration of, for example, $5\times10^{17}$ cm⁻³. Then, on buffer layer 21, breakdown voltage holding layer 22 is formed as shown in FIG. 9. As breakdown voltage holding layer 22, a layer made of silicon carbide of n type conductivity is formed using an epitaxial growth method. Breakdown voltage holding layer 22 can have a thickness of, for example, 10 μm. Further, breakdown voltage holding layer 22 includes an impurity of n type conductivity at a concentration of, for example, $5\times10^{15}$ cm⁻³.

Figure 10:
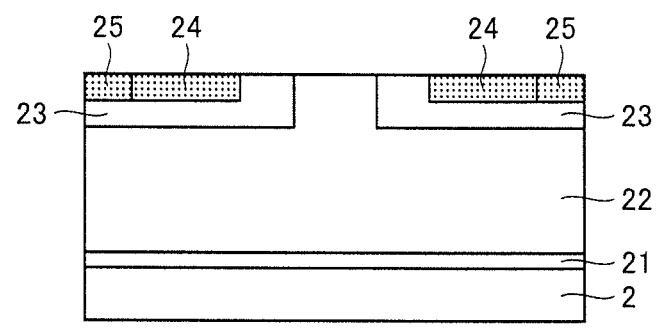
FIG. 10 is a schematic cross sectional view for illustrating the method for manufacturing the semiconductor device shown in FIG. 8.

Next, as with the step shown in FIG. 2, implantation step (S30) is performed. Specifically, an impurity of p type conductivity is implanted into breakdown voltage holding layer 22 using, as a mask, an oxide film formed through photolithography and etching, thereby forming p regions 23 as shown in FIG. 10. Further, after removing the oxide film thus used, an oxide film having a new pattern is formed through photolithography and etching. Using this oxide film as a mask, an n type impurity is implanted into predetermined regions to form n⁺ regions 24. In a similar way, an impurity of p type conductivity is implanted to form p⁺ regions 25. As a result, the structure shown in FIG. 10 is obtained.

After such an implantation step, an activation annealing treatment is performed. This activation annealing treatment can be performed under conditions that, for example, argon gas is employed as atmospheric gas, heating temperature is set at 1700° C., and heating time is set at 30 minutes.

Figure 11:
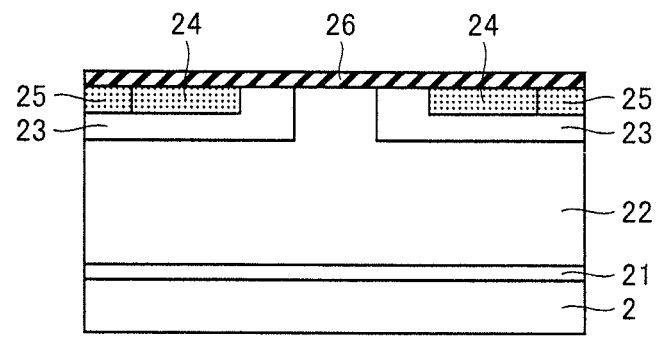
FIG. 11 is a schematic cross sectional view for illustrating the method for manufacturing the semiconductor device shown in FIG. 8.

Next, as with the step shown in FIG. 2, gate insulating film forming step (S40) is performed. Specifically, as shown in FIG. 11, oxide film 26 is formed to cover breakdown voltage holding layer 22, p regions 23, n⁺ regions 24, and p⁺ regions 25. Oxide film 26 may be formed by means of, for example, dry oxidation (thermal oxidation). The dry oxidation can be performed under conditions that heating temperature is set at 1200° C. and heating time is set at 30 minutes.

Thereafter, as with the step shown in FIG. 2, nitrogen annealing step (S50) is performed. Specifically, an annealing treatment is performed in atmospheric gas of nitrogen monoxide (NO). Temperature conditions for this annealing treatment are, for example, as follows: heating temperature is 1100° C. and heating time is 120 minutes. As a result, nitrogen atoms are introduced into a vicinity of the interface between oxide film 26 and each of breakdown voltage holding layer 22, p regions 23, n+ regions 24, and p+ regions 25, which are disposed below oxide film 26. Further, after the annealing step using the atmospheric gas of nitrogen monoxide, additional annealing may be performed using argon (Ar) gas, which is an inert gas. Specifically, using the atmospheric gas of argon gas, the additional annealing may be performed under conditions that heating temperature is set at 1100° C. and heating time is set at 60 minutes.

Figure 12:
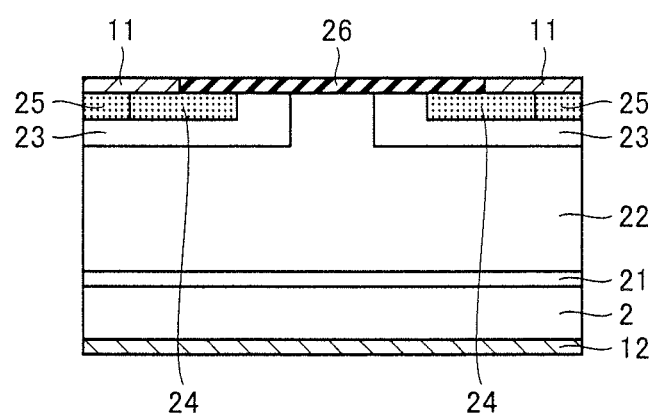
FIG. 12 is a schematic cross sectional view for illustrating the method for manufacturing the semiconductor device shown in FIG. 8.

Next, as with the step shown in FIG. 2, electrode forming step (S60) is performed. Specifically, a resist film having a pattern is formed on oxide film 26 by means of the photolithography method. Using the resist film as a mask, portions of the oxide film above n+ regions 24 and p+ regions 25 are removed by etching. Thereafter, a conductor film made of metal or the like is formed on the resist film, on the region making contact with n+ region 24 and p+ region 25 in each of the openings formed in oxide film 26, and on the main surface of substrate 2 opposite to buffer layer 21. Thereafter, the resist film is removed, thus removing (lifting off) the conductive film's portions located on the resist film. Here, as the conductor, nickel (Ni) can be used, for example. As a result, as shown in FIG. 12, source electrodes 11 and drain electrode 12 can be obtained. It should be noted that on this occasion, heat treatment for alloying is preferably performed. Specifically, using atmospheric gas of argon (Ar) gas, which is an inert gas, heat treatment (alloying treatment) is performed with heating temperature being set at 950° C. and heating time being set at 2 minutes. Thereafter, on source electrodes 11, upper source electrodes 27 (see FIG. 8) are formed. In this way, the semiconductor device shown in FIG. 8 can be obtained.

Third Embodiment

Figure 13:
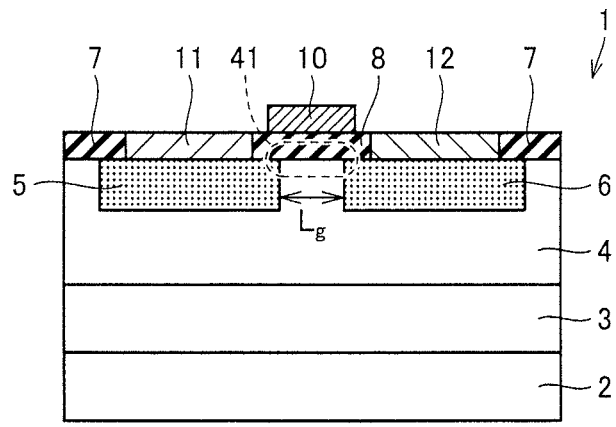
FIG. 13 is a schematic cross sectional view showing a structure of a semiconductor device in a third embodiment.

Next, referring to FIG. 13, the following describes a semiconductor device in a third embodiment. Referring to FIG. 13, semiconductor device 1 according to the present invention is configured basically the same as semiconductor device 1 shown in FIG. 1, but is different from semiconductor device 1 shown in FIG. 1 in that the maximum value of hydrogen atom concentration is equal to or greater than $1 \times 10^{21}$ cm$^{-3}$ at a boundary region 41 including a region within 10 nm from the interface between oxide film 8 and p type layer 4 serving as the semiconductor layer. Also in this way, as with the semiconductor device shown in FIG. 1, mobility (channel mobility) in the channel region including boundary region 41 can be sufficiently large in value. This is presumably due to the following reason. That is, in semiconductor device 1 shown in FIG. 13, the hydrogen atoms contained in boundary region 41 serve to reduce interface states in a manner similar to the nitrogen atoms contained in the region within 10 nm from the interface between p type layer 4 and oxide film 8 in semiconductor device 1 shown in FIG. 1.

Figure 14:
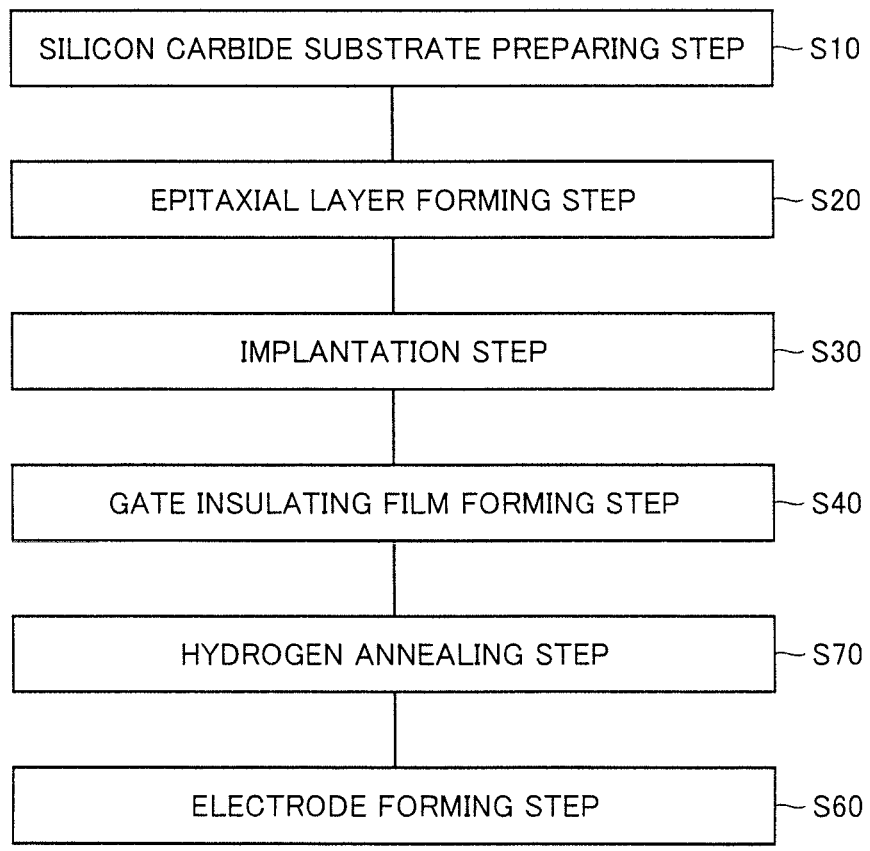
FIG. 14 is a flowchart for illustrating a method for manufacturing the semiconductor device shown in FIG. 13.

Referring to FIG. 14, the following describes a method for manufacturing the semiconductor device in the third embodiment. The method for manufacturing the semiconductor device in FIG. 14 is basically the same as the method for manufacturing the semiconductor device in the FIG. 2, but is different therefrom in that instead of nitrogen annealing step (S50) in FIG. 2, a hydrogen annealing step (S70) is performed. Specifically, as with the manufacturing method shown in FIG. 2, silicon carbide substrate preparing step (S10), epitaxial layer forming step (S20), implantation step (S30), and gate insulating film forming step (S40) are performed. Thereafter, hydrogen annealing step (S70) is performed. Specifically, heat treatment is performed using hydrogen gas (H$_2$) as atmospheric gas. This heat treatment can be performed under conditions that, for example, heating temperature is set at 1100° C. and heating time is set at 1 hour. As a result, the hydrogen atoms can be introduced into the interface region between oxide film 7 and each of p type layer 4 and n+ regions 5, 6. Further, in this hydrogen annealing step, an annealing step using an inert gas may be performed after the annealing step using the atmospheric gas containing above-described hydrogen atoms. An example of the annealing step using an inert gas is an annealing step using argon (Ar) gas as the atmospheric gas. Further, in hydrogen annealing step (S70), water vapor or water vapor-containing oxygen gas may be used as the atmospheric gas instead of the hydrogen gas.

Thereafter, as with the manufacturing method shown in FIG. 2, electrode forming step (S60) is performed as shown in FIG. 14, thereby obtaining semiconductor device 1 shown in FIG. 13.

Fourth Embodiment

Figure 15:
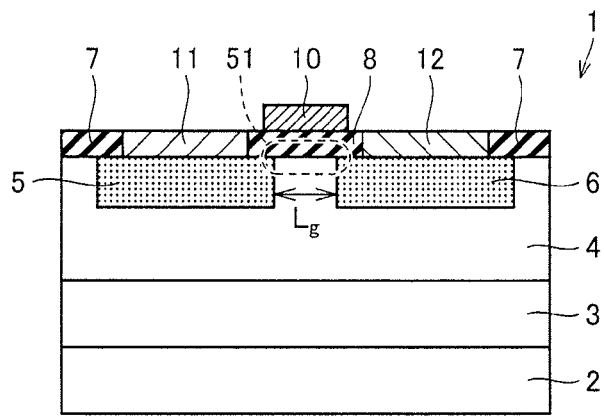
FIG. 15 is a schematic cross sectional view showing a structure of a semiconductor device in a fourth embodiment.

Referring to FIG. 15, the following describes a semiconductor device in a fourth embodiment. Referring to FIG. 15, semiconductor device 1 in the present embodiment is configured basically the same as semiconductor device 1 shown in FIG. 1, but is different from semiconductor device 1 shown in FIG. 1 in that the maximum value of the total concentration of nitrogen atoms and hydrogen atoms is equal to or greater than $1 \times 10^{21}$ cm$^{-3}$ in a boundary region 51 including a region within 10 nm from the interface between oxide film 8 and p type layer 4 serving as the semiconductor layer. Also in this way, as with the semiconductor device shown in FIG. 1, mobility (channel mobility) in the channel region including boundary region 41 can be sufficiently large in value.

Figure 16:
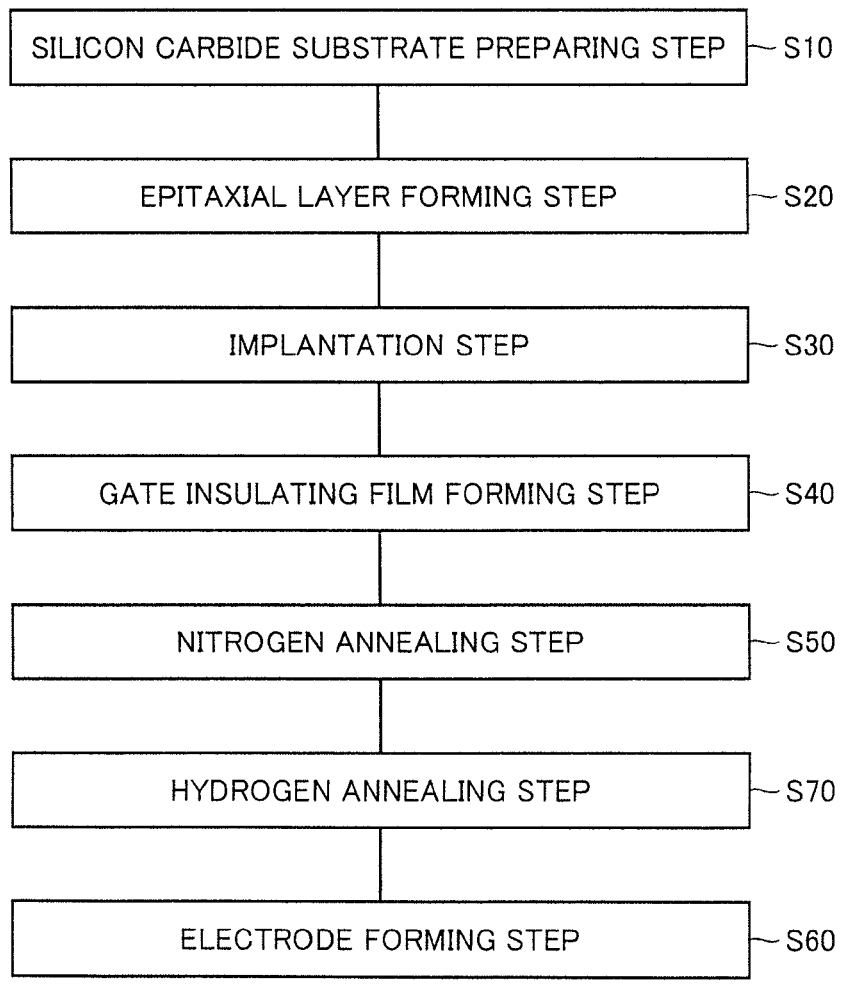
FIG. 16 is a flowchart for illustrating a method for manufacturing the semiconductor device shown in FIG. 15.

Referring to FIG. 16, the following describes a method for manufacturing semiconductor device 1 in the fourth embodiment. The method for manufacturing the semiconductor device in FIG. 16 is basically the same as the method for manufacturing the semiconductor device in the FIG. 2, but is different therefrom in that hydrogen annealing step (S70) is performed after nitrogen annealing step (S50) in FIG. 16 and before electrode forming step (S60). Specifically, as with the manufacturing method shown in FIG. 2, silicon carbide substrate preparing step (S10), epitaxial layer forming step (S20), implantation step (S30), gate insulating film forming step (S40), and nitrogen annealing step (S50) are performed. Thereafter, hydrogen annealing step (S70) is performed. This step (S70) can be performed under the same conditions (conditions of annealing using hydrogen gas) as that in hydrogen annealing step (S70) of the manufacturing method of the third embodiment. As a result, the nitrogen atoms and the hydrogen atoms can be introduced into the interface region between oxide film 7 and each of p type layer 4 and n+ regions 5, 6. It should be noted that in hydrogen annealing step (S70), water vapor or water vapor-containing oxygen gas may be used as the atmospheric gas instead of the hydrogen gas. Further, hydrogen annealing step (S70) may be performed before nitrogen annealing step (S50). Furthermore, hydrogen annealing step (S70) and nitrogen annealing step (S50) may be performed simultaneously by performing heat treatment using atmospheric gas containing hydrogen atoms and nitrogen atoms.

Thereafter, as with the manufacturing method shown in FIG. 2, electrode forming step (S60) is performed as shown in FIG. 16, thereby obtaining semiconductor device 1 shown in FIG. 15.

Figure 17:
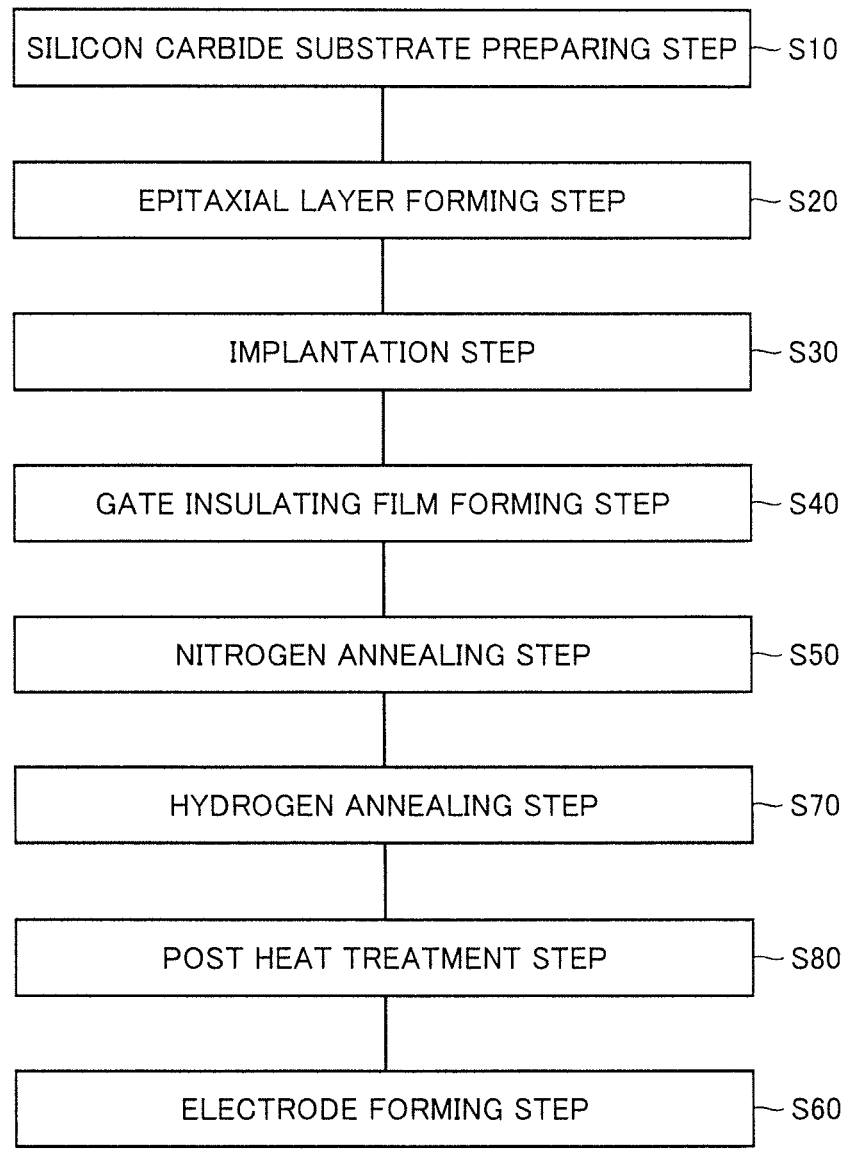
FIG. 17 is a flowchart showing a variation of the method for manufacturing the semiconductor device in FIG. 16.

Referring to FIG. 17, the following describes a variation of the method for manufacturing the semiconductor device in the fourth embodiment. A method for manufacturing the semiconductor device in FIG. 17 is basically the same as the method for manufacturing the semiconductor device in FIG. 16, but is different therefrom in that a post heat treatment step (S80) is performed after hydrogen annealing step (S70) in FIG. 16 and before electrode forming step (S60). Specifically, as with the manufacturing method shown in FIG. 16, silicon carbide substrate preparing step (S10), epitaxial layer forming step (S20), implantation step (S30), gate insulating film forming step (S40), nitrogen annealing step (S50), and hydrogen annealing step (S70) are performed. Thereafter, post heat treatment step (S80) is performed. Specifically, an annealing step using an inert gas is performed. This annealing step can be performed under conditions that an inert gas (for example, argon (Ar)) is used as the atmospheric gas, heating temperature is set at 1100° C., and heating time is set at 60 minutes. The annealing step thus performed using the inert gas provides more securely the effect of reducing the interface states by means of the nitrogen atoms and hydrogen atoms introduced into the channel region in nitrogen annealing step (S50) and hydrogen annealing step (S70).

Thereafter, as with the manufacturing method shown in FIG. 2, electrode forming step (S60) is performed as shown in FIG. 17, thereby obtaining semiconductor device 1 shown in FIG. 15.

It should be noted that a heat treatment step similar to the above-described post heat treatment step (S80) may be additionally performed between nitrogen annealing step (S50) and hydrogen annealing step (S70). Further, also in the manufacturing method shown in FIG. 17, hydrogen annealing step (S70) may be performed before nitrogen annealing step (S50). Furthermore, hydrogen annealing step (S70) and nitrogen annealing step (S50) may be performed simultaneously by performing heat treatment using atmospheric gas containing hydrogen atoms and nitrogen atoms.

Figure 18:
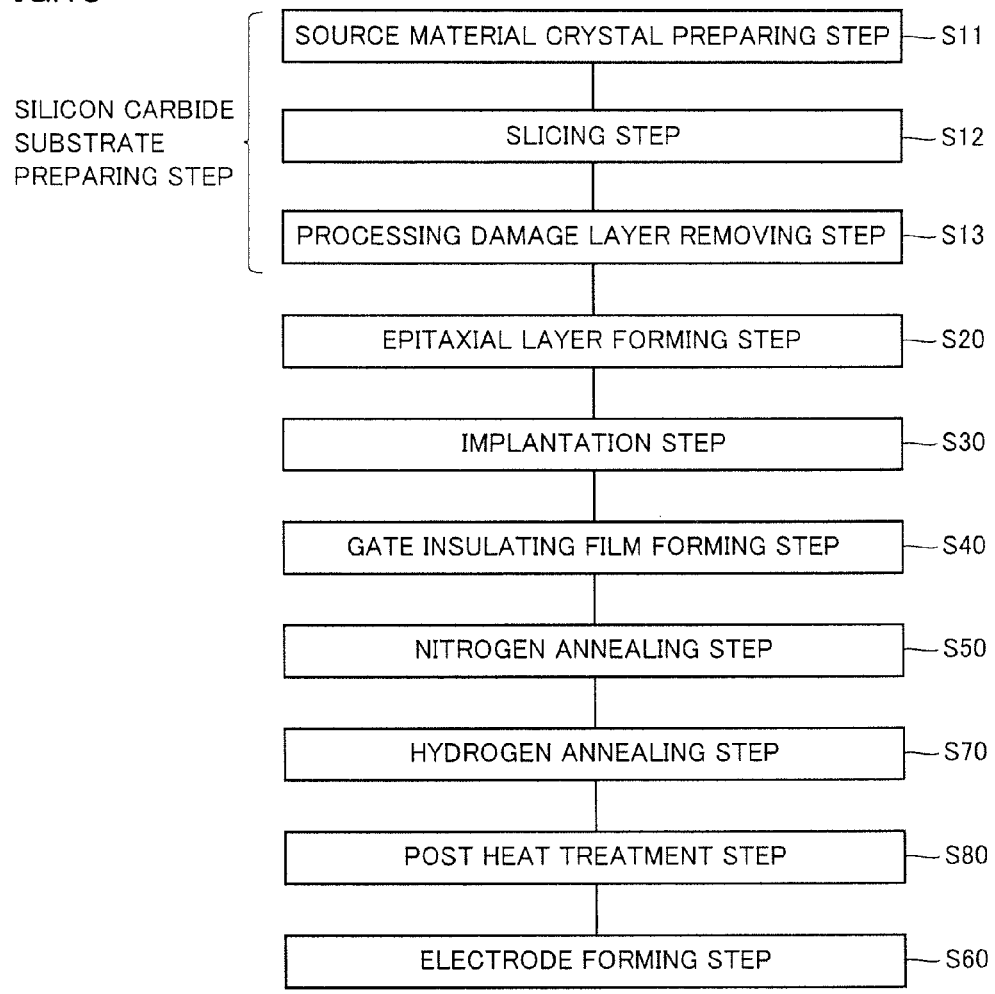
FIG. 18 is a flowchart showing a second variation of the method for manufacturing the semiconductor device in FIG. 16.

Referring to FIG. 18, the following describes a second variation of the method for manufacturing the semiconductor device in the fourth embodiment. The method for manufacturing the semiconductor device in FIG. 18 is basically the same as the method for manufacturing the semiconductor device in FIG. 17, but is different from the manufacturing method shown in FIG. 17 in terms of the silicon carbide substrate preparing step.

Specifically, referring to FIG. 18, the silicon carbide substrate preparing step in the present variation includes: a source material crystal preparing step (S11); a slicing step (S12); and a processing damage layer removing step (S13). In step (S11), for example, a source material crystal made of silicon carbide of 4H type is fabricated by means of a sublimation method. In step (S12), the source material crystal thus fabricated in step (S11) is sliced to obtain substrate 2. In doing so, the source material crystal is sliced such that substrate 2 will have one main surface corresponding to the (0-33-8) plane (plane at the carbon plane side) and will have the other main surface corresponding to the (03-38) plane (plane at the silicon plane side).

As a result of the slicing in step (S12), processing damage layers are formed in regions including both the main surfaces of substrate 2. In step (S13), at least the processing damage layer at the (03-38) plane side is removed. This processing damage layer can be removed by means of an etching process such as fused KOH etching, dry etching, or thermal etching, or by means of polishing, for example. On the other hand, the main surface at the (0-33-8) plane side, i.e., the main surface on which the epitaxial layer is to be formed in the subsequent step is smoothed to have a surface roughness suitable for epitaxial growth by means of a combination of mechanical polishing (MP), chemical mechanical polishing (CMP), and the like. As a result, the processing damage layer is also removed from the region including the main surface at the (0-33-8) plane side. It should be noted that as with the (03-38) plane side, the region including the main surface at the (0-33-8) plane side may be smoothed after removing the processing damage layer.

Thereafter, as shown in FIG. 18, as with the manufacturing method shown in FIG. 17, epitaxial layer forming step (S20), implantation step (S30), gate insulating film forming step (S40), nitrogen annealing step (S50), hydrogen annealing step (S70), post heat treatment step (S80), and electrode forming step (S60) are performed, thereby obtaining the semiconductor device of the second variation.

According to the manufacturing method in the second variation, the processing damage layer introduced in step (S12) into the region including the (03-38) plane in substrate 2 is removed in step (S13). Further, the processing damage layer introduced into the region including the (0-33-8) plane in substrate 2 is removed by the polishing process such as MP, CMP, or the like. Accordingly, stacking faults are suppressed from growing due to the processing damage layer in the process, such as gate insulating film forming step (S40), in which heating is performed at approximately 1000° C.-1200° C. Accordingly, the stacking faults, which would otherwise cause deterioration of characteristics of the semiconductor device, (stacking faults corresponding to a peak in a wavelength of around 500 nm when photoluminescence measurement is performed under a room temperature) can be suppressed from being generated in substrate 2 as well as in epitaxial layer 3 and p type layer 4 each serving as the semiconductor layer and formed on substrate 2 by means of epitaxial growth. As a result, according to the manufacturing method in the second variation, there can be manufactured a semiconductor device 1 in which a ratio of strength of a peak in a wavelength of around 500 nm to strength of a peak in a wavelength of around 390 nm is not more than 0.1 or not more than 0.01 when photoluminescence measurement is performed for epitaxial layer 3 and p type layer 4. In such a semiconductor device 1, the detrimental stacking faults corresponding to the peak in the wavelength of around 500 nm are suppressed from being generated in the semiconductor layer (epitaxial layer 3 and p type layer 4). This leads to improved characteristics of semiconductor device 1.

It should be noted that in each of the third and fourth embodiments, the lateral type MOSFET has been illustrated as semiconductor device 1, but the feature of each of the third and fourth embodiments may be applied to the vertical type DiMOSFET shown in FIG. 8. Specifically, in semiconductor device 1 shown in FIG. 8, the maximum value of the hydrogen atom concentration or the maximum value of the total concentration of the nitrogen atoms and the hydrogen atoms may be $1 \times 10^{21}$ cm$^{-3}$ or greater in the region within 10 nm from the interface between oxide film 26 and each of the semiconductor layers, i.e., each of n$^+$ regions 24, p$^+$ regions 25, p regions 23, and breakdown voltage holding layer 22. Further, main surface 2A of substrate 2 at the semiconductor side can be adapted to correspond to the (0-33-8) plane.

Fifth Embodiment

Figure 19:
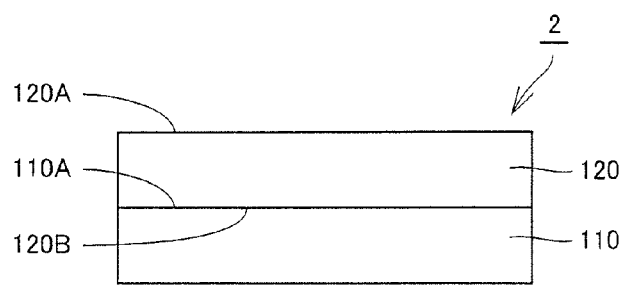
FIG. 19 is a schematic cross sectional view showing a structure of a silicon carbide substrate in a fifth embodiment.

Referring to FIG. 19, the following describes a semiconductor device in a fifth embodiment of the present invention.

The semiconductor device in the present embodiment has basically the same structure and provides basically the same effect as those of the semiconductor device in each of the first to fourth embodiments. However, the semiconductor device in the present embodiment is different from that in each of the first to fourth embodiments in terms of a structure of substrate 2.

Referring to FIG. 19, substrate 2, which constitutes semiconductor device 1 in the present embodiment, includes: a base layer 110 made of silicon carbide; and a SiC layer 120 made of single-crystal silicon carbide and disposed on one main surface 110A of base layer 110. Base layer 110 and SiC layer 120 are formed of different crystals. SiC layer 120 has a defect density smaller than that of base layer 110.

It is difficult for a high-quality silicon carbide single-crystal to have a large diameter. Meanwhile, for efficient manufacturing in a process of manufacturing a semiconductor device using a silicon carbide substrate, a substrate provided with predetermined uniform shape and size is required. Hence, even when a high-quality silicon carbide single-crystal (for example, silicon carbide single-crystal having a small defect density) is obtained, a region that cannot be processed into such a predetermined shape and the like by cutting, etc., may not be effectively used.

To address this, substrate 2 constituting the semiconductor device of the present embodiment includes base layer 110 made of silicon carbide, and SiC layer 120 made of single-crystal silicon carbide and formed on base layer 110, wherein SiC layer 120 has a defect density smaller than that of base layer 110. Thus, base substrate 110 formed of low-quality silicon carbide crystal having a large defect density is processed to have the above-described predetermined shape and size, thereby obtaining base layer 110. On such a base layer 110, a high-quality silicon carbide single-crystal not shaped into the desired shape and the like is disposed as SiC layer 120. Substrate 2 thus obtained has the predetermined uniform shape and size, thus attaining effective manufacturing of semiconductor devices 1. Further, the silicon carbide substrate thus obtained utilizes such a high-quality SiC layer 120 to manufacture a semiconductor device 1, thereby effectively utilizing silicon carbide single-crystal. As a result, according to the semiconductor device of the present invention, there can be provided a semiconductor device 1 allowing for reduced manufacturing cost.

Further, the half width of X-ray rocking curve of SiC layer 120 may be smaller than that of base layer 110.

Further, base layer 110 may have an impurity concentration greater than $2\times10^{19}$ cm$^{-3}$ whereas SiC layer 120 may have an impurity concentration greater than $5\times10^{18}$ cm$^{-3}$ and smaller than $2\times10^{19}$ cm$^3$.

According to the study conducted by the inventors, when the impurity concentration is smaller than $2\times10^{19}$ cm$^{-3}$ in the substrate made of silicon carbide, generation of stacking faults resulting from heat treatment (for example, thermal oxidation treatment) in the process of manufacturing the semiconductor device can be suppressed, but when the impurity concentration exceeds $2\times10^{19}$ cm$^{-3}$, it is difficult to suppress the stacking faults. Hence, when the impurity concentration exceeds $2\times10^{19}$ cm$^{-3}$, it is preferable to perform the step of removing a processing damage layer as in the second variation of the fourth embodiment.

Meanwhile, generation of such stacking faults can be suppressed at least in SiC layer 120 without removing the processing damage layer even when heat treatment is subsequently performed in the process of fabricating the device, by providing substrate 2 made of silicon carbide with a layer (base layer 110) having an impurity concentration greater than $2\times10^{19}$ cm$^{-3}$ and having small resistivity; and disposing, on base layer 110, a layer (SiC layer 120) having an impurity concentration smaller than $2\times10^{19}$ cm$^3$. Then, an epitaxial growth layer (active layer) made of SiC is formed on such a SiC layer 120 to fabricate semiconductor device 1, thereby achieving reduced resistivity of silicon carbide substrate 2 due to the existence of base layer 110 and suppressing influence of stacking faults, which can be generated in base layer 110, over the characteristics of the semiconductor device. Meanwhile, when SiC layer 120 has an impurity concentration of $5\times10^{18}$ cm$^{-3}$ or smaller, the resistivity of SiC layer 120 becomes too large. Accordingly, substrate 2 suitable for the vertical type semiconductor device shown in FIG. 8 (semiconductor device in which current flows in the thickness direction of substrate 2) cannot be obtained, disadvantageously.

Thus, by setting the impurity concentration of base layer 110 to be larger than $2\times10^{19}$ cm$^{-3}$ and setting the impurity concentration of SiC layer 120 to be larger than $5\times10^{18}$ cm$^{-3}$ and smaller than $2\times10^{19}$ cm$^{-3}$, there can be obtained semiconductor device 1 capable of achieving reduced on-resistance while suppressing occurrence of stacking faults resulting from heat treatment in the process of fabricating the semiconductor device.

Here, SiC layer 120 preferably has a micro pipe density smaller than that of base layer 110. Further, SiC layer 120 preferably has a threading screw dislocation density smaller than that of base layer 110. Further, SiC layer 120 preferably has a threading edge dislocation density smaller than that of base layer 110. Further, SiC layer 120 preferably has a basal plane dislocation density smaller than that of base layer 110. Further, SiC layer 120 preferably has a composite dislocation density smaller than that of base layer 110. Further, SiC layer 120 preferably has a stacking fault density smaller than that of base layer 110. Further, SiC layer 120 preferably has a point defect density smaller than that of base layer 110.

Thus, as compared with base layer 110, SiC layer 120 has the reduced defect densities such as the micro pipe density, the threading screw dislocation density, the threading edge dislocation density, the basal plane dislocation density, the composite dislocation density, the stacking fault density, and the point defect density. Such a SiC layer 120 allows a high-quality active layer (epitaxial growth layer) to be formed on SiC layer 120.

Further, base layer 110 and SiC layer 120 described above are connected to each other, for example. Accordingly, silicon carbide substrate 2 can be readily obtained in which SiC layer 120 is provided while suppressing propagation of the defects of base layer 110. On this occasion, base layer 110 and SiC layer 120 may be directly connected to each other or may be connected to each other via an intermediate layer.

Figure 20:
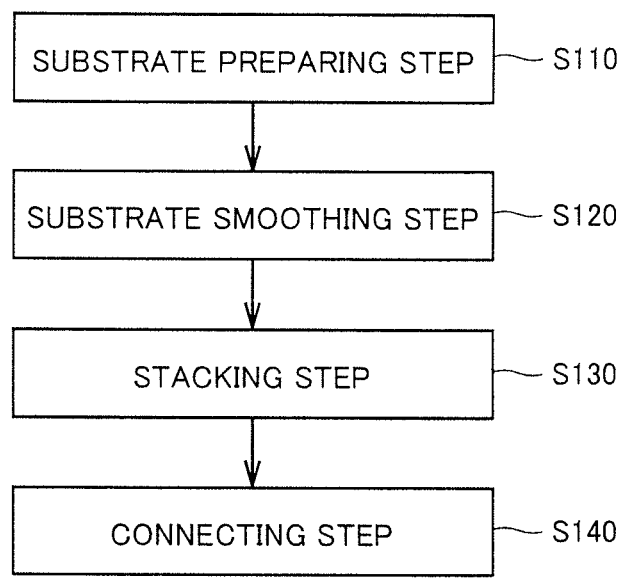
FIG. 20 is a flowchart schematically showing a method for manufacturing the silicon carbide substrate.

The following describes a method for manufacturing substrate 2 in the present embodiment. Referring to FIG. 20, in the method for manufacturing the silicon carbide substrate in the present embodiment, the substrate preparing step is performed as step (S110). In this step (S110), referring to FIG. 19, base substrate 110 formed of single-crystal silicon carbide and SiC substrate 120 formed of single-crystal silicon carbide are prepared.

SiC substrate 120 has a main surface 120A, which will be the main surface of substrate 2 that will be obtained by this manufacturing method. Hence, on this occasion, the plane orientation of main surface 120A of SiC substrate 120 is selected in accordance with desired plane orientation. Here, for example, a SiC substrate 120 having a main surface corresponding to the (0-33-8) plane is prepared. Meanwhile, a substrate having an impurity concentration greater than, for example, $2\times10^{19}$ cm$^{-3}$ is adopted as base substrate 110. Further, for SiC substrate 120, a substrate is employed which has, for example, an impurity concentration greater than $5\times10^{18}$ cm$^{-3}$ and smaller than $2\times10^{19}$ cm$^{-3}$.

Next, a substrate smoothing step is performed as a step (S120). This step (S120) is not an essential step, but can be performed when the smoothness of base substrate 110 and/or SiC substrate 120 prepared in step (S110) is insufficient. Specifically, for example, the main surface(s) of base substrate 110 and/or SiC substrate 120 are polished. On the other hand, by omitting this step, manufacturing cost can be reduced. Further, an etching process may be performed to remove a processing damage layer, which is formed in a region including a main surface of SiC substrate 120 when obtaining SiC substrate 120 from a source material crystal (ingot). The etching process can be performed by means of, for example, fused KOH etching.

Next, as a step (S130), a stacking step is performed. In this step (S130), referring to FIG. 19, base substrate 110 and SiC substrate 120 are stacked on each other such that their main surfaces 110A, 120B are in contact with each other. In this way, a stacked substrate is fabricated.

Next, as a step (S140), a connecting step is performed. In this step (S140), base substrate 110 and SiC substrate 120 are connected to each other by, for example, heating the stacked substrate to fall within a range of temperatures equal to or greater than the sublimation temperature of silicon carbide. In this way, referring to FIG. 19, substrate 2 including base layer 110 and SiC layer. 120 is completed. This substrate 2 is used in the method for manufacturing the semiconductor device in the present embodiment, and semiconductor device 1 is manufactured in the same manner as those in the first to fourth embodiments.

Here, the heating temperature for the stacked substrate in step (S140) is preferably not less than 1800° C. and not more than 2500° C. If the heating temperature is lower than 1800° C., it takes a long time to connect base substrate 110 and SiC substrate 120, which results in decreased efficiency in manufacturing substrate 2. On the other hand, if the heating temperature exceeds 2500° C., surfaces of base substrate 110 and SiC substrate 120 become rough, which may result in generation of a multiplicity of defects in substrate 2 to be fabricated. In order to improve efficiency in manufacturing while restraining generation of defects in substrate 2, the heating temperature for the stacked substrate in step (S140) is preferably set at not less than 1900° C. and not more than 2100° C. Further, the pressure of atmosphere upon the heating in step (S140) is set at not less than $10^{-5}$ Pa and not more than $10^6$ Pa, more preferably, not less than $10^{-2}$ Pa and not more than $10^4$ Pa. In this way, the above-described connection can be achieved using a simple device. Further, the atmosphere upon the heating in step (S140) is preferably inert gas atmosphere. More preferably, the atmosphere is inert gas atmosphere containing at least one selected from a group consisting of argon, helium, and nitrogen.

Sixth Embodiment

As a sixth embodiment, the following describes another method for manufacturing the substrate constituting the semiconductor device of the present invention, with reference to FIG. 21 to FIG. 24. The method for manufacturing the substrate in the sixth embodiment is performed in basically the same manner as that of the fifth embodiment. However, the method for manufacturing the substrate in the sixth embodiment is different from that of the fifth embodiment in terms of the process of forming base layer 110.

Figure 21:
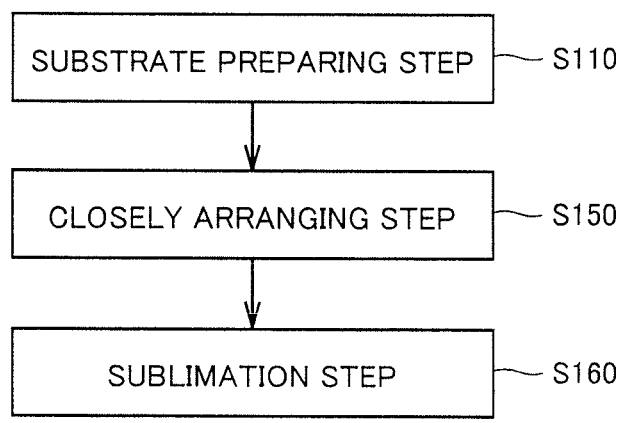
FIG. 21 is a flowchart schematically showing a method for manufacturing a silicon carbide substrate in a sixth embodiment.
Figure 22:
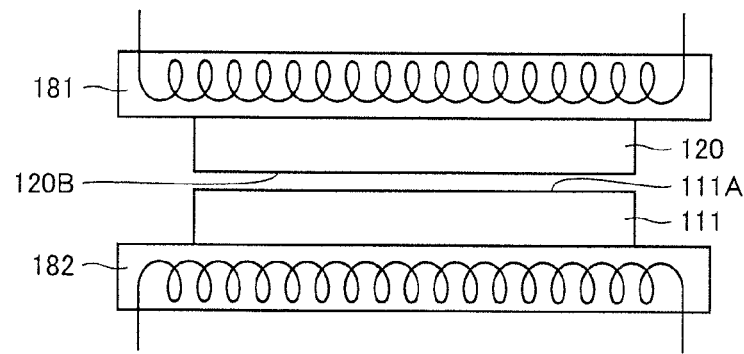
FIG. 22 is a schematic cross sectional view for illustrating the method for manufacturing the silicon carbide substrate in the sixth embodiment.

Referring to FIG. 21, in the method for manufacturing the substrate in the sixth embodiment, the substrate preparing step is performed as step (S110). In this step (S110), referring to FIG. 22, SiC substrate 120 is prepared as with that in the fifth embodiment and a material substrate 111 made of silicon carbide is prepared. Material substrate 111 may be made of single-crystal silicon carbide or polycrystal silicon carbide, or may be a sintered compact of silicon carbide. Further, instead of material substrate 111, material powder made of silicon carbide can be employed.

Next, as a step (S150), a closely arranging step is performed. In this step (S150), referring to FIG. 22, SiC substrate 120 and material substrate 111 are respectively held by a first heater 181 and a second heater 182 disposed face to face each other. In doing so, SiC substrate 120 and material substrate 111 are disposed close to each other such that their main surfaces, i.e., a main surface 120B and a main surface 111A face each other with a space of not less than 1 μm and not more than 1 cm, for example, a space of approximately 1 mm interposed therebetween.

Figure 23:
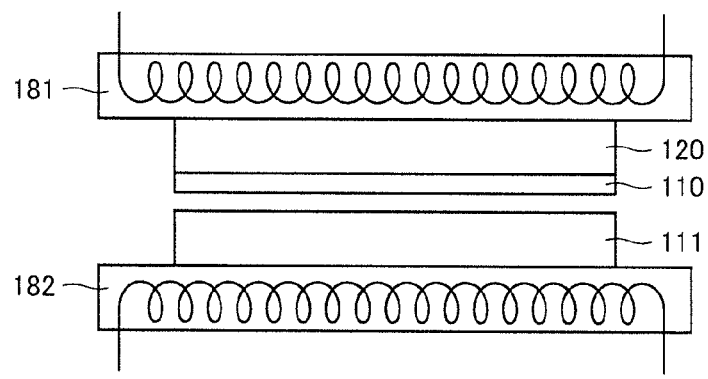
FIG. 23 is a schematic cross sectional view for illustrating the method for manufacturing the silicon carbide substrate in the sixth embodiment.
Figure 24:
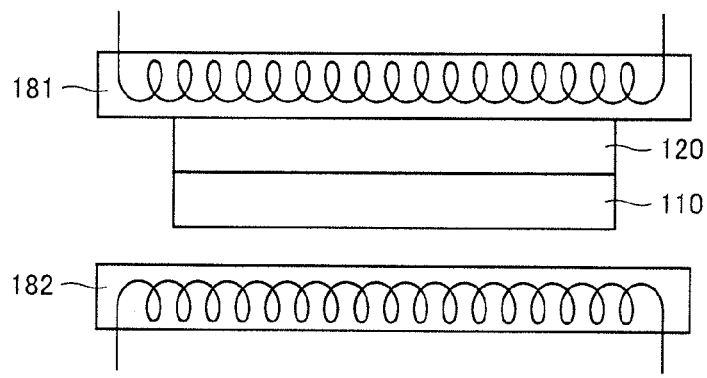
FIG. 24 is a schematic cross sectional view for illustrating the method for manufacturing the silicon carbide substrate in the sixth embodiment.

Next, as a step (S160), a sublimation step is performed. In this step (S160), SiC substrate 120 is heated by first heater 181 to a predetermined substrate temperature. Further, material substrate 111 is heated to a predetermined material temperature by second heater 182. On this occasion, material substrate 111 is heated to reach the material temperature, thereby sublimating SiC from the surface of the material substrate. On the other hand, the substrate temperature is set lower than the material temperature. Specifically, for example, the substrate temperature is set lower than the source material temperature by not less than 1° C. and not more than 100° C. The substrate temperature is preferably 1800° C. or greater and 2500° C. or smaller, for example. Accordingly, as shown in FIG. 23, SiC sublimated from material substrate 111 in the form of gas reaches the surface of SiC substrate 120 and is accordingly solidified thereon, thereby forming base layer 110. With this state being maintained, as shown in FIG. 24, all the SiC constituting material substrate 111 is sublimated and is transferred onto the surface of SiC substrate 120. Accordingly, step (S160) is completed, thereby completing substrate 2 shown in FIG. 19.

Seventh Embodiment

The following describes yet another embodiment of the present invention, i.e., a seventh embodiment. A semiconductor device in the seventh embodiment has basically the same structure as that of the fifth embodiment. However, the semiconductor device of the seventh embodiment is different from that of the fifth embodiment in terms of its manufacturing method.

Figure 25:
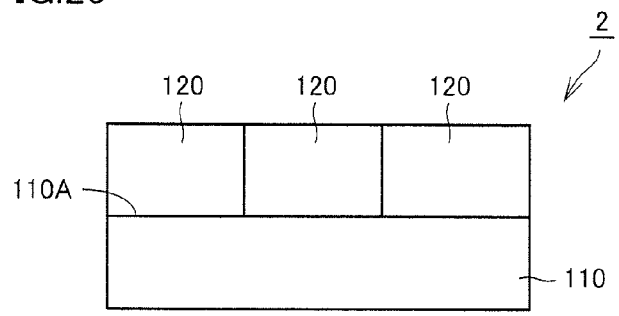
FIG. 25 is a schematic cross sectional view showing a structure of a silicon carbide substrate in a seventh embodiment.

Specifically, a substrate different in structure from that of the fifth embodiment is prepared in the silicon carbide substrate preparing step performed as step (S10) in the method for manufacturing the semiconductor device in the seventh embodiment. Referring to FIG. 25, in substrate 2 prepared in the seventh embodiment, a plurality of SiC layers 120 are arranged side by side when viewed in a planar view. In other words, the plurality of SiC layers 120 are arranged along main surface 110A of base layer 110. More specifically, the plurality of SiC layers 120 are arranged in the form of a matrix on base layer 110 such that adjacent SiC layers 120 are in contact with each other. Accordingly, substrate 2 of the present embodiment can be handled as a substrate 2 having high-quality SiC layers 120 and a large diameter. Utilization of such a substrate 2 allows for efficient manufacturing process of semiconductor devices. It should be noted that substrate 2 in the seventh embodiment can be manufactured in a manner similar to that in the fifth embodiment or the sixth embodiment as follows. That is, in step (S130) of the fifth embodiment, a plurality of SiC substrates 120 are arranged side by side when viewed in a planar view (see FIG. 19). Alternatively, in step (S150) of the sixth embodiment, a plurality of SiC substrates 120 are arranged side by side on and held by first heater 181 (see FIG. 22).

Further, in the method for manufacturing semiconductor device 1 in the present embodiment, semiconductor device 1 is manufactured using substrate 2 thus obtained. Here, by forming a semiconductor layer and the like on SiC layers 120 of substrate 2 shown in FIG. 25, a plurality of semiconductor devices 1 arranged side by side when viewed in a planar view are fabricated. On this occasion, each semiconductor device 1 is fabricated so as not to extend across a boundary region between adjacent SiC layers 120.

Eighth Embodiment

The following describes still another embodiment of the present invention, i.e., an eighth embodiment. Semiconductor device 1 in the eighth embodiment has basically the same structure and provides basically the same effects as those of semiconductor device 1 in the fifth embodiment. However, semiconductor device 1 in the eighth embodiment is different from that of the fifth embodiment in terms of structure of substrate 2.

Figure 26:
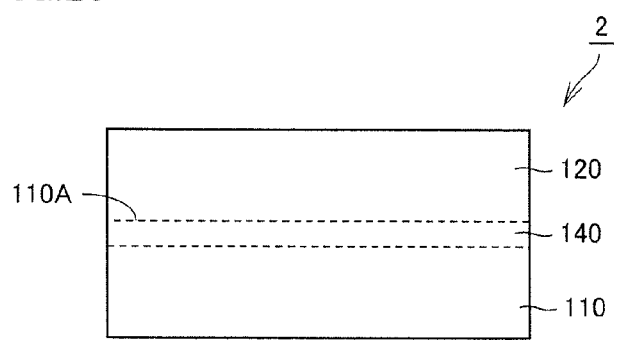
FIG. 26 is a schematic cross sectional view showing a structure of a silicon carbide substrate in an eighth embodiment.

Namely, referring to FIG. 26, in substrate 2 in the eighth embodiment, an amorphous SiC layer 140 is disposed between base layer 110 and SiC layer 120 as an intermediate layer made of amorphous SiC. Then, base layer 110 and SiC layer 120 are connected to each other by this amorphous SiC layer 140. Amorphous SiC layer 140 thus existing facilitates fabrication of substrate 2 in which base layer 110 and SiC layer 120 different from each other in impurity concentration are stacked on each other.

Figure 27:
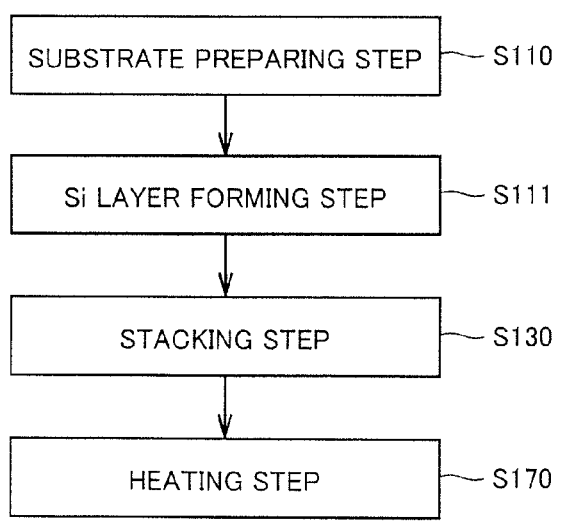
FIG. 27 is a flowchart schematically showing a method for manufacturing the silicon carbide substrate in the eighth embodiment.

The following describes a method for manufacturing substrate 2 in the eighth embodiment. Referring to FIG. 27, in the method for manufacturing substrate 2 in the eighth embodiment, the substrate preparing step is performed as step (S110) in the same way as in the fifth embodiment, so as to prepare base substrate 110 and SiC substrate 120.

Next, as a step (S111), a Si layer forming step is performed. In this step (S111), a Si layer having a thickness of approximately 100 nm is formed on one main surface of base substrate 110 prepared in step (S110), for example. This Si layer can be formed using a sputtering method, for example.

Next, the stacking step is performed as step (S130). In this step (S130), SiC substrate 120 prepared in step (S110) is placed on the Si layer formed in step (S111). In this way, a stacked substrate is obtained in which SiC substrate 120 is provided over base substrate 110 with the Si layer interposed therebetween.

Next, as a step (S170), a heating step is performed. In this step (S170), the stacked substrate fabricated in step (S130) is heated, for example, in a mixed gas atmosphere of hydrogen gas and propane gas under a pressure of $1\times10^3$ Pa at approximately 1500° C. for 3 hours. Accordingly, the Si layer is supplied with carbon as a result of diffusion mainly from base substrate 110 and SiC substrate 120, thereby forming amorphous SiC layer 140 as shown in FIG. 26. Accordingly, substrate 2 of the eighth embodiment can be readily manufactured in which base layer 110 and SiC layer 120 different from each other in impurity density are connected to each other by amorphous SiC layer 140, for example.

Ninth Embodiment

The following describes yet another embodiment of the present invention, i.e., a ninth embodiment. A semiconductor device 1 in the ninth embodiment has basically the same structure and provides basically the same effects as those of semiconductor device 1 in the fifth embodiment. However, semiconductor device 1 in the ninth embodiment is different from that of the fifth embodiment in terms of structure of substrate 2.

Figure 28:
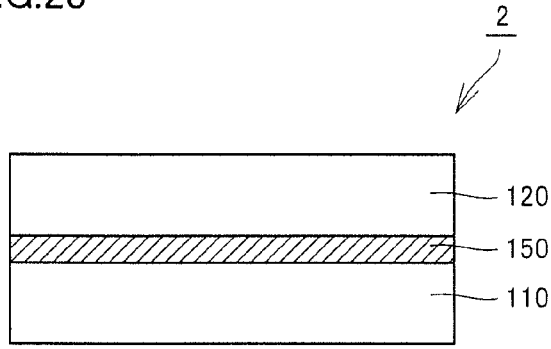
FIG. 28 is a schematic cross sectional view showing a structure of a silicon carbide substrate in a ninth embodiment.

Specifically, referring to FIG. 28, substrate 2 in the ninth embodiment is different from that of the fifth embodiment in that an ohmic contact layer 150 serving as an intermediate layer is formed between base layer 110 and SiC layer 120 by siliciding at least a portion of a metal layer. Further, base layer 110 and SiC layer 120 are connected to each other by this ohmic contact layer 150. Ohmic contact layer 150 thus existing facilitates fabrication of substrate 2 in which base layer 110 and SiC layer 120 different in impurity concentration are stacked on each other, for example.

Figure 29:
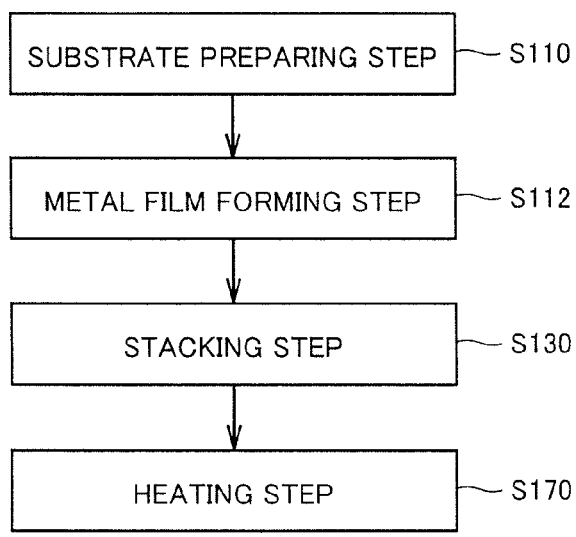
FIG. 29 is a flowchart schematically showing a method for manufacturing the silicon carbide substrate in the ninth embodiment.

The following describes a method for manufacturing substrate 2 in the ninth embodiment. Referring to FIG. 29, in the method for manufacturing substrate 2 in the ninth embodiment, the substrate preparing step is performed as step (S110) as with that in the fifth embodiment to prepare base substrate 110 and SiC substrate 120.

Next, a metal film forming step is performed as a step (S112). In this step (S112), a metal film is formed by, for example, depositing a metal on one main surface of base substrate 110 prepared in step (S110). This metal film includes, for example, at least one of metals forming silicide when being heated, such as nickel, molybdenum, titanium, aluminum, and tungsten.

Next, the stacking step is performed as step (S130). In this step (S130), SiC substrate 120 prepared in step (S110) is placed on the metal film formed in step (S112). In this way, a stacked substrate is obtained in which SiC substrate 120 is provided over base substrate 110 with the metal film interposed therebetween.

Next, as step (S170), the heating step is performed. In this step (S170), the stacked substrate fabricated in step (S130) is heated to approximately 1000° C. in an inert gas atmosphere such as argon, for example. In this way, at least a portion of the metal film (a region thereof making contact with base substrate 110 and a region thereof making contact with the SiC substrate) is silicided to form ohmic contact layer 150 making ohmic contact with base layer 110 and SiC layer 120. As a result, substrate 2 of the ninth embodiment can be readily manufactured in which base layer 110 and SiC layer 120 different in impurity concentration are connected to each other by ohmic contact layer 150, for example.

Tenth Embodiment

The following describes yet another embodiment of the present invention, i.e., a tenth embodiment. A semiconductor device 1 in the tenth embodiment has basically the same structure and provides basically the same effects as those of semiconductor device 1 in the fifth embodiment. However, semiconductor device 1 in the tenth embodiment is different from that of the fifth embodiment in terms of structure of substrate 2.

Figure 30:
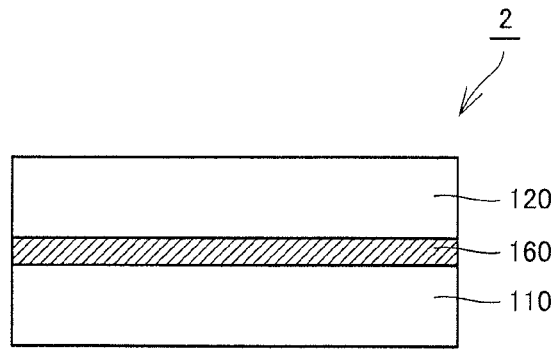
FIG. 30 is a schematic cross sectional view showing a structure of a silicon carbide substrate in a tenth embodiment.

Specifically, referring to FIG. 30, substrate 2 of the tenth embodiment is different from that of the fifth embodiment in that a carbon layer 160 is formed between base layer 110 and SiC layer 120 as an intermediate layer. Then, base layer 110 and SiC layer 120 are connected to each other by this carbon layer 160. Carbon layer 160 thus existing facilitates fabrication of substrate 2 in which base layer 110 and SiC layer 120 different in impurity concentration are stacked on each other, for example.

Figure 31:
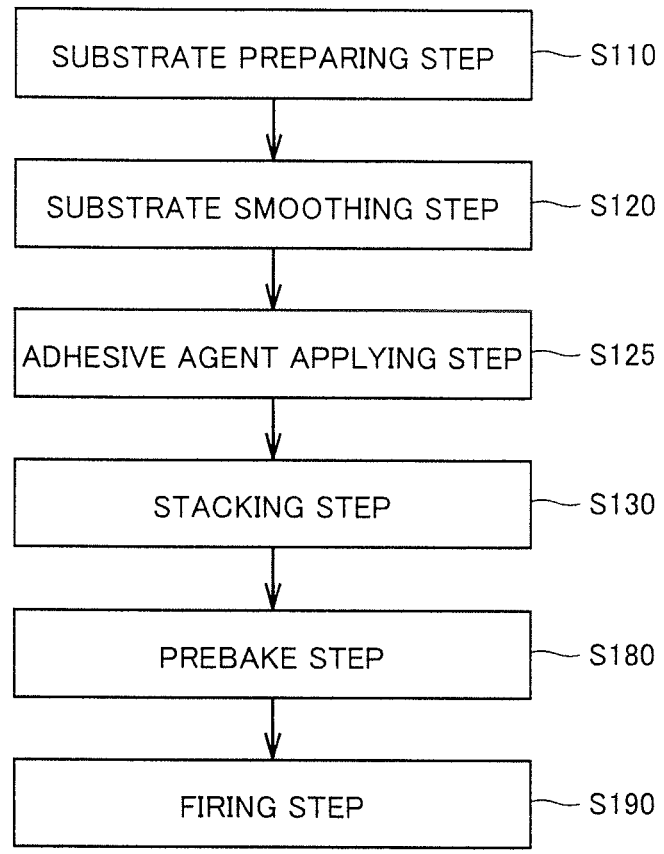
FIG. 31 is a flowchart schematically showing a method for manufacturing the silicon carbide substrate in the tenth embodiment.

The following describes a method for manufacturing substrate 2 in the tenth embodiment. Referring to FIG. 31, first, step (S110) is performed in the same way as in the fifth embodiment, and then step (S120) is performed as required in the same way as in the fifth embodiment.

Figure 32:
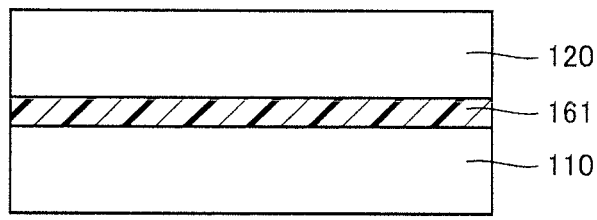
FIG. 32 is a schematic cross sectional view for illustrating the method for manufacturing the silicon carbide substrate in the tenth embodiment.

Next, as a step (S125), an adhesive agent applying step is performed. In this step (S125), referring to FIG. 32, for example, a carbon adhesive agent is applied to the main surface of base substrate 110, thereby forming a precursor layer 161. The carbon adhesive agent can be formed of, for example, a resin, graphite particles, and a solvent. Here, an exemplary resin usable is a resin formed into non-graphitizable carbon by heating, such as a phenol resin. An exemplary solvent usable is phenol, formaldehyde, ethanol, or the like. Further, the carbon adhesive agent is preferably applied at an amount of not less than 10 mg/cm$^2$ and not more than 40 mg/cm$^2$, more preferably, at an amount of not less than 20 mg/cm$^2$ and not more than 30 mg/cm$^2$. Further, the carbon adhesive agent applied preferably has a thickness of not more than 100 μm, more preferably, not more than 50 μm.

Next, the stacking step is performed as step (S130). In this step (S130), referring to FIG. 32, SiC substrate 120 is placed on and in contact with precursor layer 161 formed on and in contact with the main surface of base substrate 110, thereby fabricating a stacked substrate.

Next, as a step (S180), a prebake step is performed. In this step (S180), the stacked substrate is heated, thereby removing the solvent component from the carbon adhesive agent constituting precursor layer 161. Specifically, for example, while applying a load to the stacked substrate in the thickness direction thereof, the stacked substrate is gradually heated to fall within a range of temperature exceeding the boiling point of the solvent component. Preferably, this heating is performed with base substrate 110 and SiC substrate 120 being pressed against each other using a clamp or the like. Further, by performing the prebaking (heating) as long as possible, the adhesive agent is degassed to improve strength in adhesion.

Next, as a step (S190), a firing step is performed. In this step (S190), the stacked substrate with precursor layer 161 heated and accordingly prebaked in step (S180) is heated to a high temperature, preferably, not less than 900° C. and not more than 1100° C., for example, 1000° C. for preferably not less than 10 minutes and not more than 10 hours, for example, for 1 hour, thereby firing precursor layer 161. Atmosphere employed upon the firing can be an inert gas atmosphere such as argon. The pressure of the atmosphere can be, for example, atmospheric pressure. In this way, precursor layer 161 is formed into carbon layer 160 made of carbon. As a result, referring to FIG. 30, substrate 2 of the tenth embodiment is obtained in which base substrate (base layer) 10 and SiC substrate (SiC layer) 20 are connected to each other by carbon layer 160.

Here, the following describes characteristic configurations of the present invention although some of them have been already described in the embodiments above.

Semiconductor device 1 according to the present invention includes: substrate 2 made of silicon carbide and having a main surface having an off angle of not less than −3° and not more than +5° relative to the (0-33-8) plane in the <01-10> direction; the semiconductor layer (p type layer 4 of FIG. 1, p region 23 of FIG. 8); and the insulating film (oxide film 8 of FIG. 1, oxide film 26 of FIG. 8). The semiconductor layer (p type layer 4, p region 23) is formed on substrate 2 and is made of silicon carbide. The insulating film (oxide film 8, 26) is formed in contact with the surface of the semiconductor layer (p type layer 4, p region 23 including the channel region). The maximum value of nitrogen atom concentration is $1 \times 10^{21}$ cm$^{-3}$ or greater in the region within 10 nm from the interface between the semiconductor layer and the insulating film (the interface between the channel region and oxide film 8, 26).

In this way, carrier mobility (channel mobility) can be made larger in the channel region in the vicinity of the interface between oxide film 8, 26 serving as the gate insulating film and the channel region, than that in the case where nitrogen atoms are not contained in the vicinity of the interface, thereby achieving lower on-resistance than that of a conventional semiconductor device employing silicon. Accordingly, semiconductor device 1 can be obtained which is excellent in electric characteristic and exhibits a sufficiently large channel mobility. It should be noted that the maximum value of the nitrogen atom concentration is set at $1 \times 10^{21}$ cm$^{-3}$ or greater as described above because the channel mobility can be 50 cm$^2$/Vs or greater, which is a practically sufficient value, by setting the nitrogen atom concentration at the above-described value or greater.

In semiconductor device 1, hydrogen atoms may be contained in the region within 10 nm from the interface between the semiconductor layer (p type layer 4 of FIG. 1, p region 23 of FIG. 8) and the insulating film (oxide film 8, 26). In this case, interface states in this region can be reduced more securely.

Semiconductor device 1 according to the present invention includes: substrate 2 made of silicon carbide and having a main surface having an off angle of not less than −3° and not more than +5° relative to the (0-33-8) plane in the <01-10> direction; the semiconductor layer (p type layer 4 of FIG. 13, p region 23 of FIG. 8); and the insulating film (oxide film 8 of FIG. 13, oxide film 26 of FIG. 8). The semiconductor layer (p type layer 4, p region 23) is formed on substrate 2 and is made of silicon carbide. The insulating film (oxide film 8, 26) is formed in contact with the surface of the semiconductor layer (p type layer 4, p region 23 including the channel region). The maximum value of hydrogen atom concentration is $1 \times 10^{21}$ cm$^{-3}$ or greater in the region within 10 nm from the interface between the semiconductor layer and the insulating film (for example, the interface, included in boundary region 41 of FIG. 13, between the channel region and oxide film 8, 26).

In this way, carrier mobility can be made larger in the channel region in the vicinity of the interface between oxide film 8, 26 serving as the gate insulating film and the channel region, than that in the case where hydrogen atoms are not contained in the vicinity of the interface, thereby achieving lower on-resistance than that of a conventional semiconductor device employing silicon. It should be noted that the maximum value of the hydrogen atom concentration is set at $1 \times 10^{21}$ cm$^{-3}$ or greater as described above because the channel mobility can be 50 cm$^2$/Vs or greater, which is a practically sufficient value, by setting the hydrogen atom concentration at the above-described value or greater.

In semiconductor device 1, nitrogen atoms may be contained in the region within 10 nm from the interface between the semiconductor layer (p type layer 4 of FIG. 13, p region 23 of FIG. 8) and the insulating film (oxide film 8 of FIG. 13, oxide film 26 of FIG. 8). In this case, interface states in this region can be reduced more securely.

Semiconductor device 1 according to the present invention includes: substrate 2 made of silicon carbide and having a main surface having an off angle of not less than −3° and not more than +5° relative to the (0-33-8) plane in the <01-10> direction; the semiconductor layer (p type layer 4 of FIG. 15, p region 23 of FIG. 8); and the insulating film (oxide film 8 of FIG. 15, oxide film 26 of FIG. 8). The semiconductor layer (p type layer 4, p region 23) is formed on substrate 2 and is made of silicon carbide. The insulating film (oxide film 8, 26) is formed in contact with the surface of the semiconductor layer (p type layer 4, p region 23 including the channel region). The maximum value of the total concentration of the nitrogen atoms and the hydrogen atoms is $1 \times 10^{21}$ cm$^{-3}$ or greater in the region within 10 nm from the interface between the semiconductor layer and the insulating film (for example, the interface, included in boundary region 51 of FIG. 15, between the channel region and oxide film 8, 26).

In this way, carrier mobility can be made larger in the channel region in the vicinity of the interface between oxide film 8, 26 serving as the gate insulating film and the channel region, than that in the case where nitrogen atoms and hydrogen atoms are not contained in the vicinity of the interface, thereby achieving lower on-resistance than that of a conventional semiconductor device employing silicon. It should be noted that the maximum value of the total concentration of the nitrogen atoms and the hydrogen atoms is set at $1 \times 10^{21}$ cm$^{-3}$ or greater as described above because the channel mobility can be 50 cm$^2$/Vs or greater, which is a practically sufficient value, by setting the total concentration at the above-described value or greater.

Further, semiconductor device 1 described above includes substrate 2 made of silicon carbide and having the main surface having an off angle of not less than −3° and not more than +5° relative to the (0-33-8) plane in the <01-10> direction. More preferably, the main surface of substrate 2 has a plane orientation of substantially (0-33-8), further preferably, the main surface of the substrate has a plane orientation of (0-33-8). Here, the expression "the main surface of the substrate has a plane orientation of substantially (0-33-8)" is intended to encompass a case where the plane orientation of the main surface of the substrate is included in a range of off angle such that the plane orientation can be substantially regarded as (0-33-8) in consideration of processing accuracy of the substrate and the like. In this case, the range of off angle is, for example, a range of off angle of ±2° relative to (0-33-8). In this case, the above-described carrier mobility (channel mobility) can be the maximum.

It should be noted that the off angle is set at not less than −3° and not more than +5° relative to the (0-33-8) plane in the <01-10> direction because an experiment conducted by the inventors has revealed that the range of off angle allowing for particularly good carrier mobility (channel mobility) is at least the above-described range.

In semiconductor device 1, it is preferable that the interface state density in a level lower than the conduction band by 0.1 eV is smaller than $1 \times 10^{12}$ cm$^{-2}$ eV$^{-1}$. In this case, with the above-described interface state density, the carrier mobility of the channel region can become sufficiently large. It should be noted that in the case where the interface state density is greater than $1 \times 10^{12}$ cm$^{-2}$ eV$^{-1}$, the channel mobility in semiconductor device 1 falls below 50 cm$^2$/Vs, which is considered as a practically sufficient value. Hence, the value of the interface state density is preferably smaller than $1 \times 10^{12}$ cm$^{-2}$ eV$^{-1}$.

Performed in the method for manufacturing the semiconductor device in the present invention is the step (substrate preparing step (S10)) of preparing substrate 2 made of silicon carbide and having its main surface having an off angle of not less than −3° and not more than +5° relative to the (0-33-8) plane in the <01-10> direction. Performed next is the step (epitaxial layer forming step (S20)) of forming the semiconductor layer on substrate 2. Performed thereafter is the step (gate insulating film forming step (S40)) of forming the insulating film in contact with the surface of the semiconductor layer. Performed thereafter is the step (nitrogen annealing step (S50)) of adjusting the nitrogen atom concentration such that the maximum value of the nitrogen atom concentration becomes $1 \times 10^{21}$ cm$^{-3}$ or greater in the region within 10 nm from the interface between the semiconductor layer and the insulating film. In this way, semiconductor device 1 according to the present invention can be readily manufactured which has increased carrier mobility (channel mobility).

The method for manufacturing the semiconductor device may further include the step (for example, hydrogen annealing step (S70) of FIG. 16 or FIG. 17) of providing hydrogen atoms in the region within 10 nm from the interface between the semiconductor layer (p type layer 4, p region 23) and the insulating film (oxide film 8, 26). In this case, the semiconductor device can be readily manufactured which contains the hydrogen atoms in addition to the nitrogen atoms in the above-described region.

In the method for manufacturing the semiconductor device, the step (hydrogen annealing step (S70)) of providing the hydrogen atoms includes the step of heating the substrate having the insulating film (oxide film 8, 26) formed thereon, using gas containing hydrogen atoms as atmospheric gas. In this case, the hydrogen atom concentration can be readily adjusted in the vicinity of the interface between the semiconductor layer (p type layer 4, p region 23 including the channel region) and oxide film 8, 26.

In the method for manufacturing the semiconductor device, the step (hydrogen annealing step (S70)) of providing the hydrogen atoms may include the step of heating the substrate using an inert gas as atmospheric gas after the step of heating using the gas containing the hydrogen atoms as the atmospheric gas. In this case, the carrier mobility of semiconductor device 1 can be further increased.

In the method for manufacturing the semiconductor device, nitrogen annealing step (S50) may include the step of heating substrate 2 having the insulating film (oxide film 8, 26) formed thereon, using gas containing nitrogen atoms as atmospheric gas. In this case, the nitrogen atom concentration can be readily adjusted in the vicinity of the interface between the semiconductor layer (p type layer 4, p region 23 including the channel region) and oxide film 8, 26.

In the method for manufacturing the semiconductor device, nitrogen annealing step (S50) may include the step of heating substrate 2 using an inert gas (Ar gas) as the atmospheric gas, after the step of heating using the gas containing the nitrogen atoms as the atmospheric gas. In this case, the carrier mobility of semiconductor device 1 can be further increased.

Performed first in the method for manufacturing the semiconductor device in the present invention is the step (silicon carbide substrate preparing step (S10)) of preparing substrate 2 made of silicon carbide and having its main surface having an off angle of not less than −3° and not more than +5° relative to the (0-33-8) plane in the <01-10> direction. Next, the step (epitaxial layer forming step (S20)) of forming the semiconductor layer on substrate 2 is performed. Then, the step (gate insulating film forming step (S40)) of forming the insulating film in contact with the surface of the semiconductor layer is performed. Performed thereafter is the step (hydrogen annealing step (S70)) of adjusting the hydrogen atom concentration such that the maximum value of the hydrogen atom concentration becomes $1 \times 10^{21}$ cm$^{-3}$ or greater in the region within 10 nm from the interface between the semiconductor layer and the insulating film. In this way, semiconductor device 1 according to the present invention can be readily manufactured which has increased carrier mobility (channel mobility).

The method for manufacturing the semiconductor device may further include the step (nitrogen annealing step (S50)) of providing the nitrogen atoms in the region within 10 nm from the interface between the semiconductor layer (p type layer 4, p region 23) and the insulating film (oxide film 8, 26). In this case, the semiconductor device can be readily manufactured which contains the nitrogen atoms in addition to the hydrogen atoms in the above-described region.

In the method for manufacturing the semiconductor device, the step (nitrogen annealing step (S50)) of providing the nitrogen atoms may include the step of heating the substrate having the insulating film (oxide film 8, 26) formed thereon, using gas containing nitrogen atoms as atmospheric gas. In this case, the nitrogen atom concentration can be readily adjusted in the vicinity of the interface between the semiconductor layer (p type layer 4, p region 23 including the channel region) and oxide film 8, 26.

In the method for manufacturing the semiconductor device, the step (nitrogen annealing step (S50)) of providing the nitrogen atoms may include the step of heating the substrate using an inert gas as the atmospheric gas, after the step of heating using the gas containing the nitrogen atoms as the atmospheric gas. In this case, the carrier mobility of semiconductor device 1 can be further increased.

In the method for manufacturing the semiconductor device, the step (hydrogen annealing step (S70)) of adjusting the hydrogen atom concentration may include the step of heating the substrate having the insulating film (oxide film 8, 26) formed thereon, using the gas containing the hydrogen atoms as the atmospheric gas. In this case, the hydrogen atom concentration can be readily adjusted in the vicinity of the interface between the semiconductor layer (p type layer 4, p region 23 including the channel region) and oxide film 8, 26.

In the method for manufacturing the semiconductor device, the step (hydrogen annealing step (S70)) of adjusting the hydrogen atom concentration may include the step of heating the substrate using an inert gas as the atmospheric gas, after the step of heating using the gas containing the hydrogen atoms as the atmospheric gas. In this case, the carrier mobility of semiconductor device 1 can be further increased.

In the method for manufacturing the semiconductor device, the gas containing the hydrogen atoms may be water vapor or water vapor-containing oxygen gas. In this case, the water vapor, which is readily available and readily handled, is used as the atmospheric gas. Accordingly, hydrogen annealing step (S70) described above can be performed relatively readily.

Performed first in the method for manufacturing the semiconductor device in the present invention is the step (silicon carbide substrate preparing step (S10)) of preparing substrate 2 made of silicon carbide and having its main surface having an off angle of not less than −3° and not more than +5° relative to the (0-33-8) plane in the <01-10> direction. Next, the step (epitaxial layer forming step (S20)) of forming the semiconductor layer on substrate 2 is performed. Performed next is the step (gate insulating film forming step (S40)) of forming the insulating film in contact with the surface of the semiconductor layer. Performed thereafter is the step (nitrogen annealing step (S50) and hydrogen annealing step (S70)) of adjusting the total concentration of the nitrogen atoms and the hydrogen atoms such that the maximum value of the total concentration thereof becomes $1 \times 10^{21}$ cm$^{-3}$ or greater in the region within 10 nm from the interface between the semiconductor layer and the insulating film. In this way, semiconductor device 1 according to the present invention can be readily manufactured which has increased carrier mobility (channel mobility).

EXAMPLES

Example 1

The following describes an experiment conducted to confirm the effect of the present invention.

(As to Samples)

Semiconductor devices each having the structure shown in FIG. 1 were fabricated as samples in the following manner. That is, an epitaxial layer 3 having a thickness of 10 μm was formed on an n type silicon carbide substrate 2 having a thickness of 400 μm. On epitaxial layer 3, a p type layer 4 having a thickness of 1 μm was formed. Then, phosphorus (P) was implanted thereinto as an n type impurity for n$^+$ regions 5, 6. As the impurity concentration, a value of $1 \times 10^{20}$ cm$^{-3}$ was employed. Further, a gate length (channel length $L_g$), which was a distance between n$^+$ regions 5, 6, was set at 100 μm. Further, a gate width (channel width) was set at 200 μm.

Then, an oxide film was formed by means of dry oxidation treatment, and then nitrogen annealing was performed. In this way, a sample was fabricated. Another sample was also fabricated by forming the oxide film, then performing the nitrogen annealing, and then performing annealing treatment (argon annealing treatment) using argon gas, which was an inert gas, as atmosphere. Here, the dry oxidation treatment for forming oxide film 8 was performed under conditions that heating temperature was set at 1200° C. and heating time was set at 30 minutes. The oxide film thus formed had a thickness of 33-46 nm. Further, in the nitrogen annealing step, nitrogen monoxide gas was used as the atmospheric gas, heating temperature was set at 1100° C., and heating time was set at 60 minutes. Further, the sample to be subjected to the argon annealing treatment underwent the nitrogen annealing step under conditions that nitrogen monoxide gas was used as the atmospheric gas, heating temperature was set at 1100° C., and heating time was set at 120 minutes. The argon annealing treatment was performed under conditions that argon gas was used as the atmospheric gas, heating temperature was set at 1100° C., and heating time was set at 60 minutes. Still another sample was also fabricated which had not been through the nitrogen annealing step after the formation of the gate insulating film.

Then, as with the manufacturing method in the first embodiment, as shown in FIG. 1, a source electrode 11 and a drain electrode 12 were formed. Then, a gate electrode 10 was formed on oxide film 8 serving as the gate insulating film. Each of source electrode 11 and drain electrode 12 was made of nickel (Ni) and had a thickness of 0.1 μm. Gate electrode 10 was made of aluminum (Al) and had a thickness of 1 μm.

(Measurement Method)

Next, channel mobility of each of the above-described samples was measured. As a measurement method, the following method was employed. That is, with source-drain voltage $V_{DS}$=0.1 V, gate voltage $V_G$ was applied and source-drain current $I_{DS}$ was measured (gate voltage dependency was measured). Then, with $g_m = (\delta I_{DS})/(\delta V_G)$, the maximum value of the channel mobility with respect to the gate voltage was calculated in accordance with the following formula:

$$\text{channel mobility } \mu = g_m \times (L \times d)/(W \times \epsilon \times V_{DS})$$

where L represents the gate length, d represents the thickness of the oxide film, W represents the gate width, and c represents the dielectric constant of the oxide film.

(Result of Measurement)

Figure 33:
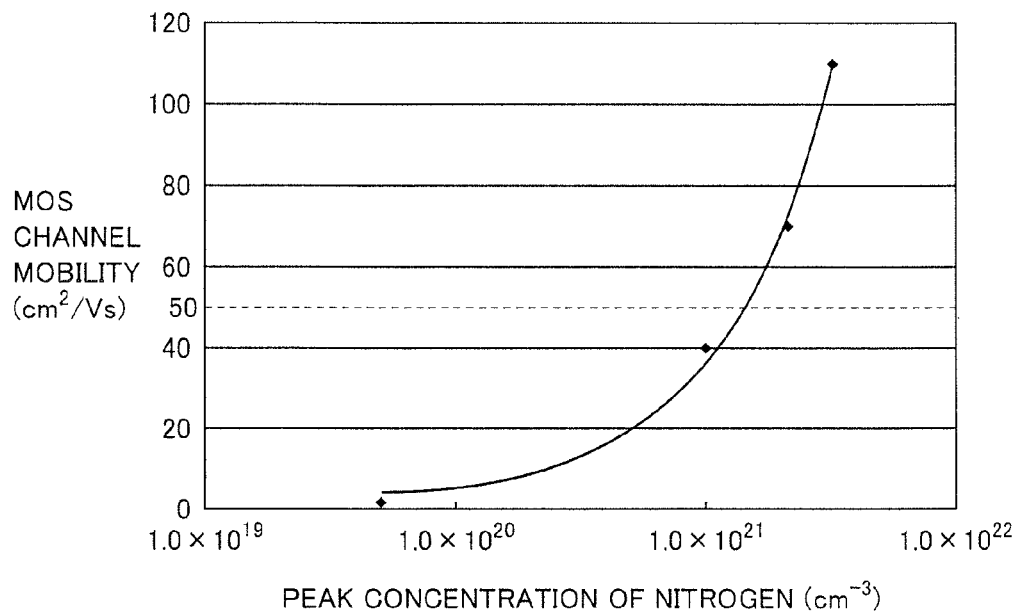
FIG. 33 is a graph showing a relation between channel mobility and a value of a peak of nitrogen atom concentration.

A result of the measurement for the mobility in the channel is shown in FIG. 33. In FIG. 33, the horizontal axis represents the peak value (peak concentration of the nitrogen atoms) of the nitrogen atom concentration measured in each of the samples, whereas the vertical axis represents the measured channel mobility (MOS channel mobility) of the semiconductor device.

As shown in FIG. 33, the MOS channel mobility was increased as the peak concentration of nitrogen was higher. Here, the minimally required channel mobility to achieve a lower on-resistance than that of a conventional MOSFET which adopts silicon as its source material is considered to be approximately 50 $cm^2/Vs$. Hence, referring to FIG. 33, with the peak concentration of the nitrogen atoms being set at $1 \times 10^{21}$ $cm^{-3}$ or greater, it is considered that channel mobility of a sufficient value can be achieved.

Example 2

The following describes an experiment conducted to confirm the effect attained when hydrogen atoms are provided in a region within 10 nm from an interface between a semiconductor layer and an insulating film.

(As to Samples)

Semiconductor devices each having the structure shown in FIG. 1 were fabricated as samples in the following manner. That is, an epitaxial layer 3 having a thickness of 10 μm was formed on an n type silicon carbide substrate 2 having a thickness of 400 μm. On epitaxial layer 3, a p type layer 4 having a thickness of 1 μm was formed. Next, phosphorus (P) was implanted thereinto as an n type impurity for n+ regions 5, 6. The concentration of this impurity was set at $1 \times 10^{20}$ $cm^{-3}$. Further, a gate length (channel length $L_g$), which was a distance between n+ regions 5, 6, was set at 100 μm. Further, a gate width (channel width) was set at 200 μm.

Then, an oxide film was formed by means of dry oxidation treatment, and then hydrogen annealing was performed. In this way, a sample was fabricated. Another sample was also fabricated by forming the oxide film, then performing the hydrogen annealing, and then performing annealing treatment (argon annealing treatment) using argon gas, which was an inert gas, as atmosphere. Here, the dry oxidation treatment for forming oxide film 8 was performed under conditions that heating temperature was set at 1200° C. and heating time was set at 30 minutes. The oxide film thus formed had a thickness of 33-45 nm. Further, in the hydrogen annealing step, hydrogen gas was used as the atmospheric gas, heating temperature was set at 1100° C., and heating time was set at 60 minutes. Further, the sample to be subjected to the argon annealing treatment underwent the hydrogen annealing under conditions that hydrogen gas was used as the atmospheric gas, heating temperature was set at 1100° C., and heating time was set at 120 minutes. In the argon annealing treatment, argon gas was used as the atmospheric gas, heating temperature was set at 1100° C., and heating time was set at 60 minutes. Still another sample was also fabricated which had not been through the hydrogen annealing step after the formation of the gate insulating film.

After the formation of the insulating film described above, as with the manufacturing method in the first embodiment of the present invention, as shown in FIG. 1, a source electrode 11 and a drain electrode 12 were formed. Then, a gate electrode 10 was formed on oxide film 8 serving as the gate insulating film. Each of source electrode 11 and drain electrode 12 was made of nickel (Ni) and had a thickness of 0.1 μm. Gate electrode 10 was made of aluminum (Al) and had a thickness of 1 μm.

(Measurement Method)

Next, channel mobility of each of the above-described samples was measured. For the measurement method, the same method as that used in the experiment of example 1 was employed.

(Result of Measurement)

A result of the measurement of the mobility in the channel showed a relation similar to the relation illustrated above and shown in FIG. 33, i.e., the relation between the peak value of the nitrogen atom concentration and the channel mobility. In other words, as with the case of FIG. 33, the MOS channel mobility was increased as the peak concentration of nitrogen was higher. Now, an approximation line is drawn in the graph to approximate the data indicating the relation between the peak concentration of the hydrogen atoms and the channel mobility. This approximation line is substantially the same curve as the approximation line (curve) in the graph of FIG. 33. Here, the minimally required channel mobility to achieve a lower on-resistance than that of a conventional MOSFET which adopts silicon as its source material is considered to be approximately 50 $cm^2/Vs$. Hence, with the peak concentration of the hydrogen atoms being set at $1 \times 10^{21}$ $cm^{-3}$ or greater, it is considered that channel mobility of a sufficient value can be achieved.

Example 3

The following describes an experiment in which water vapor was used as atmospheric gas in heat treatment to provide hydrogen atoms in a region within 10 nm from an interface between a semiconductor layer and an insulating film.

(As to Samples)

Semiconductor devices each having the structure shown in FIG. 1 were fabricated as samples. The method of fabricating the samples was basically the same as the method of fabricating the samples in example 2. That is, an epitaxial layer 3 having a thickness of 10 μm was formed on n type silicon carbide substrate 2 having a thickness of 400 μm. On epitaxial layer 3, a p type layer 4 having a thickness of 1 μm was formed. Next, phosphorus (P) was implanted thereinto as an n type impurity for n+ regions 5, 6. The impurity concentration was set at $1 \times 10^{20}$ $cm^{-3}$. Further, a gate length (channel length $L_g$), which was a distance between n+ regions 5, 6, was set at 100 μm. Further, a gate width (channel width) was set at 200 μm.

Then, an oxide film was formed by means of dry oxidation treatment, and then water vapor-containing oxygen gas annealing was performed. In this way, a sample was fabricated. Another sample was also fabricated by forming the oxide film, then performing the water vapor-containing oxygen gas annealing, and then performing annealing treatment (argon annealing treatment) using argon gas, which was an inert gas, as atmosphere. Here, the dry oxidation treatment for forming oxide film 8 was performed under conditions that heating temperature was set at 1200° C. and heating time was set at 30 minutes. The oxide film thus formed had a thickness of 33-44 nm. Further, in the water vapor-containing oxygen gas annealing step, water vapor-containing oxygen gas was used as the atmospheric gas, heating temperature was set at 1100° C., and heating time was set at 60 minutes. Further, the sample to be subjected to the argon annealing treatment underwent the water vapor-containing oxygen gas annealing under conditions that water vapor-containing oxygen gas was used as the atmospheric gas, heating temperature was set at 1100° C., and heating time was set at 120 minutes. The argon annealing treatment was performed under conditions that argon gas was used as the atmospheric gas, heating temperature was set at 1100° C., and heating time was set at 60 minutes. Still another sample was also fabricated which had not been through the water vapor-containing oxygen gas annealing step after the formation of the gate insulating film.

After the formation of the insulating film described above, as with the manufacturing method in the first embodiment of the present invention, as shown in FIG. 1, a source electrode 11 and a drain electrode 12 were formed. Then, a gate electrode 10 was formed on oxide film 8 serving as the gate insulating film. Each of source electrode 11 and drain electrode 12 was made of nickel (Ni) and had a thickness of 0.1 μm. Gate electrode 10 was made of aluminum (Al) and had a thickness of 1 μm.

(Measurement Method)

Next, channel mobility of each of the above-described samples was measured. For the measurement method, the same method as that used in the experiment of example 1 was employed.

(Result of Measurement)

A result of the measurement of the mobility in the channel showed a relation similar to the relation illustrated above and shown in FIG. 33, i.e., the relation between the peak value of the nitrogen atom concentration and the channel mobility. In other words, as with the case of FIG. 33, the MOS channel mobility was increased as the peak concentration of hydrogen was higher. Now, an approximation line is drawn in the graph to approximate the data indicating the relation between the peak concentration of the hydrogen atoms and the channel mobility. This approximation line is substantially the same curve as the approximation line (curve) in the graph of FIG. 33. Here, the minimally required channel mobility to achieve a lower on-resistance than that of a conventional MOSFET which adopts silicon as its source material is considered to be approximately 50 cm²/Vs. Hence, with the peak concentration of the hydrogen atoms being set at $1\times10^{21}$ cm$^{-3}$ or greater, it is considered that channel mobility of a sufficient value can be achieved.

Example 4

Next, the following describes an experiment in which gas containing nitrogen atoms and hydrogen atoms was employed as atmospheric gas in heat treatment to provide nitrogen atoms and hydrogen atoms in a region within 10 nm from an interface between a semiconductor layer and an insulating film.

(As to Samples)

Semiconductor devices each having the structure shown in FIG. 1 were fabricated as samples. The method of fabricating the samples was basically the same as the method of fabricating the samples in example 2. That is, an epitaxial layer 3 having a thickness of 10 μm was formed on n type silicon carbide substrate 2 having a thickness of 400 μm. On epitaxial layer 3, a p type layer 4 having a thickness of 1 μm was formed. Next, phosphorus (P) was implanted thereinto as an impurity having n type conductivity for n⁺ regions 5, 6. The impurity concentration was set at $1\times10^{20}$ cm$^{-3}$. Further, a gate length (channel length $L_g$), which was a distance between n⁺ regions 5, 6, was set at 100 μm. Further, a gate width (channel width) was set at 200 μm.

Then, an oxide film was formed by means of dry oxidation treatment, and then nitrogen annealing was performed. In this way, a sample was fabricated. Another sample was also fabricated by forming the gate insulating film, then performing the nitrogen annealing, and then performing hydrogen annealing. Here, the dry oxidation treatment for forming oxide film 8 was performed under conditions that heating temperature was set at 1200° C. and heating time was set at 30 minutes. The oxide film thus formed had a thickness of 33-45 nm. Further, in the nitrogen annealing step, nitrogen monoxide (NO) gas was used as the atmospheric gas, heating temperature was set at 1100° C., and heating time was set at 20 minutes or 60 minutes. Further, in the hydrogen annealing treatment, hydrogen gas was used as the atmospheric gas, heating temperature was set at 1100° C., and heating time was set at 30 minutes. Still another sample was also fabricated which had not been through the nitrogen annealing step and the hydrogen step after the formation of the gate insulating film.

After the formation of the insulating film described above, as with the manufacturing method in the first embodiment of the present invention, as shown in FIG. 1, a source electrode 11 and a drain electrode 12 were formed in each of the samples. Then, a gate electrode 10 was formed on oxide film 8 serving as the gate insulating film. Each of source electrode 11 and drain electrode 12 was made of nickel (Ni) and had a thickness of 0.1 μm. Gate electrode 10 was made of aluminum (Al) and had a thickness of 1 μm.

(Measurement Method)

Next, channel mobility of each of the above-described samples was measured. For the measurement method, the same method as that used in the experiment of example 1 was employed.

(Result of Measurement)

Figure 34:
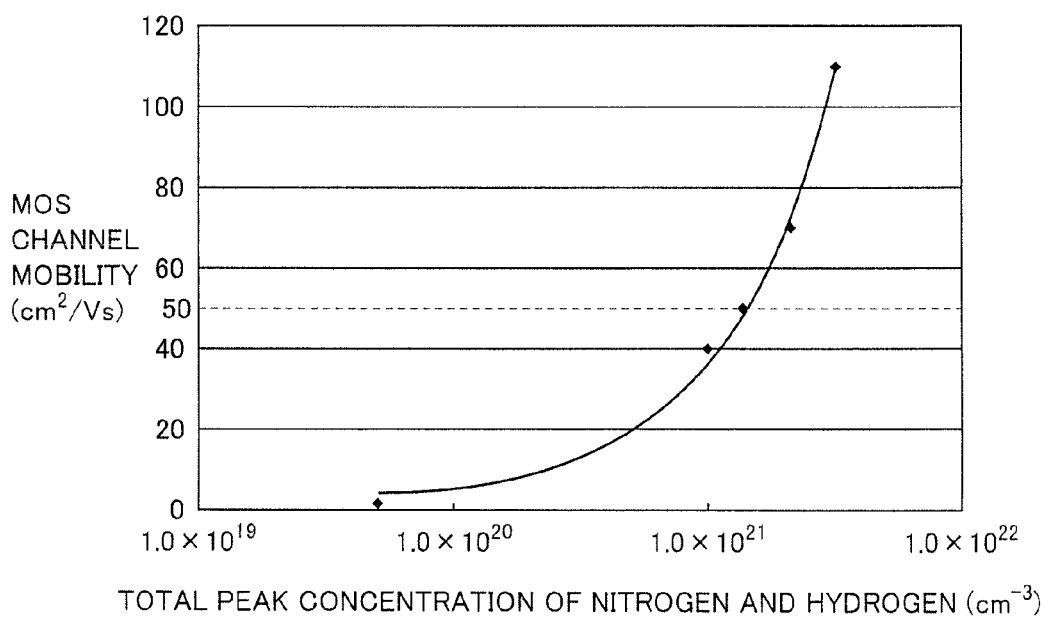
FIG. 34 is a graph showing a relation between channel mobility and a value of a peak of total concentration of nitrogen atoms and hydrogen atoms.

A result of the measurement of the mobility in the channel showed a relation similar to the relation illustrated above and shown in FIG. 33, i.e., the relation between the peak value of the nitrogen atom concentration and the channel mobility. The result of the measurement for the mobility in the channel is shown in FIG. 34. In FIG. 34, the horizontal axis represents the peak value (peak concentration of the total of nitrogen and hydrogen) of the total concentration of the nitrogen atoms and hydrogen atoms measured in each of the samples, whereas the vertical axis represents the measured channel mobility (MOS channel mobility) of the semiconductor device.

As shown in FIG. 34, the MOS channel mobility was increased as the peak concentration of the total of nitrogen and hydrogen was higher. Here, the minimally required channel mobility to achieve a lower on-resistance than that of a conventional MOSFET which adopts silicon as its source material is considered to be approximately 50 cm²/Vs. Hence, referring to FIG. 34, with the peak value of the total concentration of the nitrogen atoms and the hydrogen atoms being set at $1\times10^{21}$ cm$^{-3}$ or greater, it is considered that channel mobility of a sufficient value can be achieved.

Example 5

To confirm the effect of the present invention, semiconductor devices were fabricated and interface states at an interface between a semiconductor layer and an insulating film in each of the semiconductor devices was evaluated.

(As to Samples)

Figure 35:
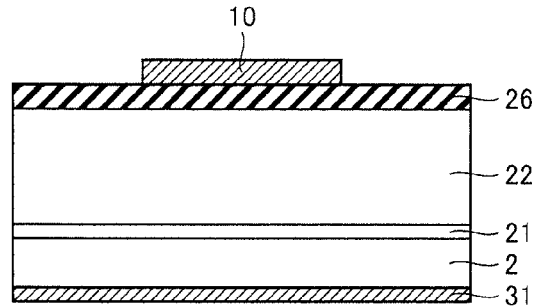
FIG. 35 is a schematic cross sectional view showing a semiconductor device prepared for measurement in an example 5.

FIG. 35 is a schematic cross sectional view showing a semiconductor device prepared for measurement in example 5. The semiconductor device shown in FIG. 35 was a MOS capacitor and included: a substrate 2 that was an n type silicon carbide substrate; a buffer layer 21 formed on substrate 2; a breakdown voltage holding layer 22 formed on buffer layer 21; an oxide film 26 formed on breakdown voltage holding layer 22; a gate electrode 10 formed on the oxide film; and a backside electrode 31 formed on the backside surface of substrate 2 (the main surface thereof opposite to its surface on which buffer layer 21 was formed).

The semiconductor device was manufactured through the following steps. First, an ingot (source material crystal) of 4H-SiC was sliced to obtain substrate 2 having a thickness of 400 μm. In doing so, substrate 2 was obtained such that one main surface of substrate 2 would correspond to the (0-33-8) plane (plane of the carbon plane side) and the other main surface thereof would correspond to the (03-38) plane (plane of the silicon plane side). Next, fused KOH etching was performed to remove a processing damage layer formed, during the slicing, in a region including a main surface. The fused KOH etching was performed under conditions that temperature was set at 520° C. and time was set at 10 minutes. Next, the main surface at the (0-33-8) plane side was polished. This polishing is performed by sequentially performing LAP (lapping), MP (mechanical polishing), and CMP (chemical mechanical polishing).

Next, on the polished main surface at the (0-33-8) plane side, buffer layer 21 and breakdown voltage holding layer 22 were formed by means of epitaxial growth. Further, oxide film 26 was formed on breakdown voltage holding layer 22 by means of thermal oxidation, and then gate electrode 10 and backside electrode 31 were formed, thereby obtaining the MOS capacitor shown in FIG. 35 (example A).

Meanwhile, for comparison, a MOS capacitor (comparative example A) was also fabricated in a process similar to that for example A but in the process, the main surface (the other main surface) at the (03-38) plane side was polished instead of the main surface at the (0-33-8) plane side, buffer layer 21, breakdown voltage holding layer 22, oxide film 26, and gate electrode 10 were formed on the other main surface, and backside electrode 31 was formed on the above-described one main surface.

In addition, a MOS capacitor (reference example A) was also fabricated in a process similar to that for example A but in the process, the processing damage layer was not removed by means of the fused KOH etching.

(Measurement Method)

The capacitance-voltage characteristic (CV characteristic) of each of the samples of example A, comparative example A, and reference example A, each of which had the configuration of the semiconductor device (MOS capacitor) shown in FIG. 35, was measured. It should be noted that high frequency CV measurement was performed at a measurement frequency of 1 MHz. Meanwhile, low frequency CV measurement was performed using a Quasistatic CV measurement method. It should be noted that capacitance $C_s$, which resulted from a depletion layer formed at the semiconductor side of the MOS interface, was calculated by solving Poisson equation. In doing so, inversion state was not taken into consideration and deep depletion state was assumed.

Further, interface state density of each of the samples of example A and comparative example A was calculated using a High-Low method. The following describes gist of the method of calculating the interface state density using the High-Low method.

In the high frequency CV measurement, capacitance $C_{it}$ relatively large in emission time constant and resulting from interface states does not appear as a capacitance component. On the other hand, in the CV measurement (low frequency CV measurement) obtained at a low frequency at which electrons can be captured to and emitted from the interface states, the capacitance is observed as a value obtained by adding capacitance resulting from the interface states to the capacitance in the high frequency CV measurement. Here, the capacitance obtained by the low frequency CV measurement includes information of oxide film capacitance, depletion layer capacitance, and interface state capacitance. Hence, capacitance $C_{LF}$ obtained by the low frequency CV measurement is expressed by the following formula (1):

$$\frac{1}{C_{LF}} = \frac{1}{C_{ox}} + \frac{1}{C_D + C_{it}} \qquad (1)$$

However, in the high frequency CV measurement, the interface state capacitance is not responded (is not detected). Hence, capacitance $C_{HF}$ obtained by the high frequency CV measurement is expressed by the following Formula (2):

$$\frac{1}{C_{HF}} = \frac{1}{C_{ox}} + \frac{1}{C_D} \qquad (2)$$

Accordingly, from the above-described formulae (1), (2), the following Formula (3) is obtained:

$$D_{it} = \frac{C_{ox}}{q}\left(\frac{C_{LF}/C_{ox}}{1-C_{LF}/C_{ox}} - \frac{C_{HF}/C_{ox}}{1-C_{HF}/C_{ox}}\right)(\because C_{it} = qD_{it}) \qquad (3)$$

From Formula (3), interface state density $D_{it}$ can be calculated.

(Result of Measurement)

Figure 37:
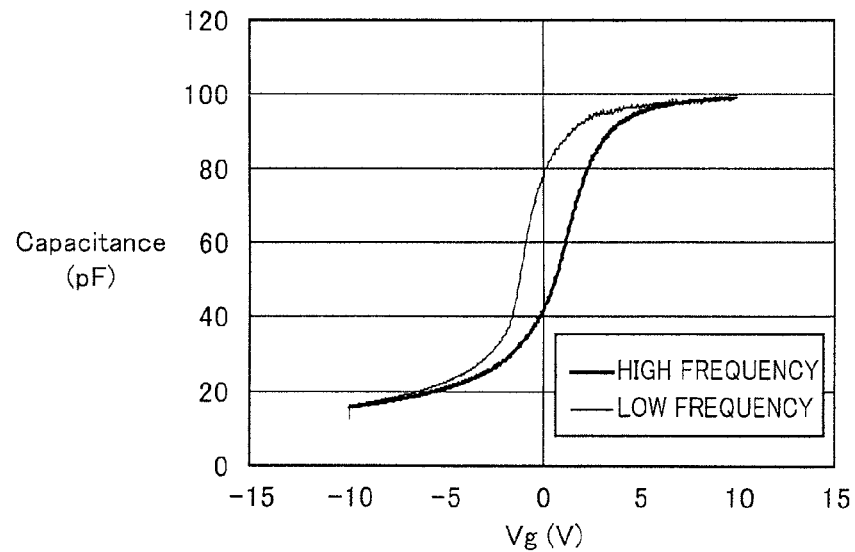
FIG. 37 is a graph showing a CV characteristic for a sample of a comparative example A.
Figure 38:
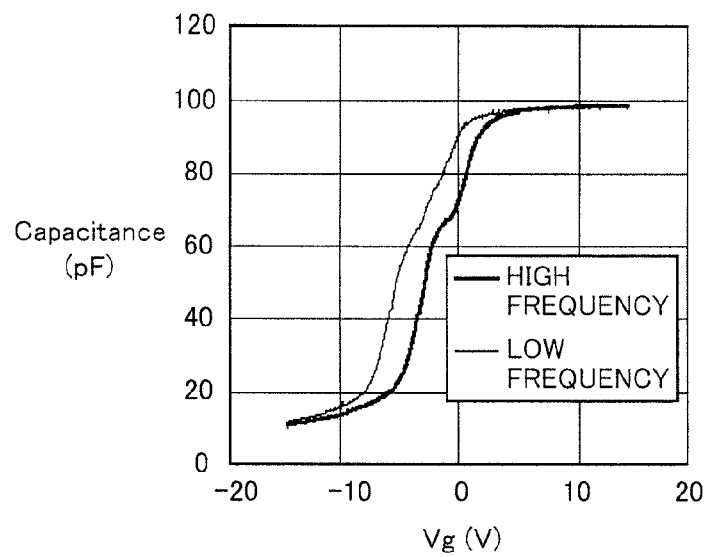
FIG. 38 is a graph showing a CV characteristic of a sample of a reference example A.
Figure 39:
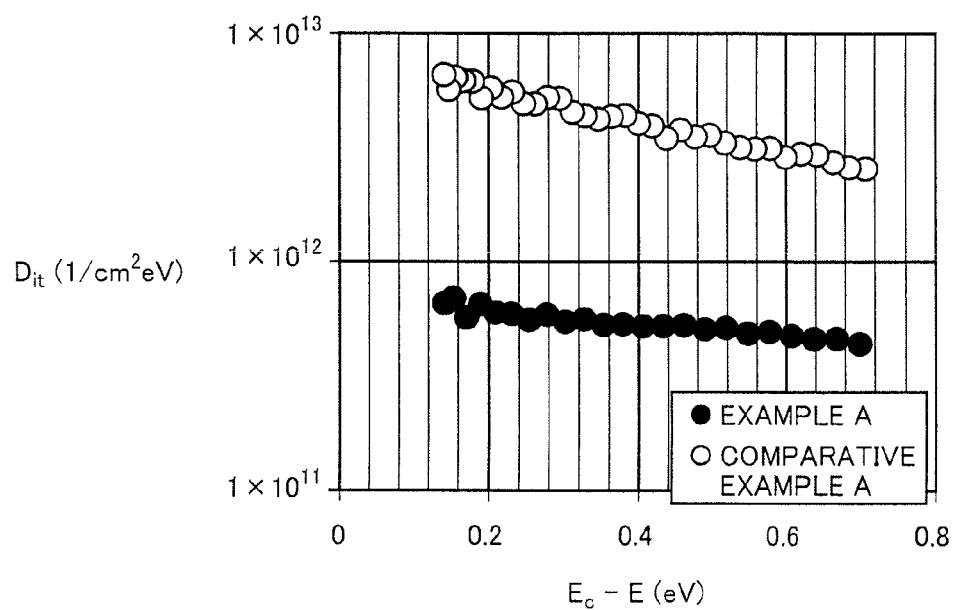
FIG. 39 is a graph showing a relation between an interface state density and energy with the conduction band regarded as a reference.

Referring to FIG. 36-FIG. 39, results of the above-described measurements will be described. It should be noted that FIG. 39 is a graph showing a relation between the interface state density calculated from the CV characteristic shown in each of FIG. 36 and FIG. 37 and energy with the conduction band regarded as a reference.

Figure 36:
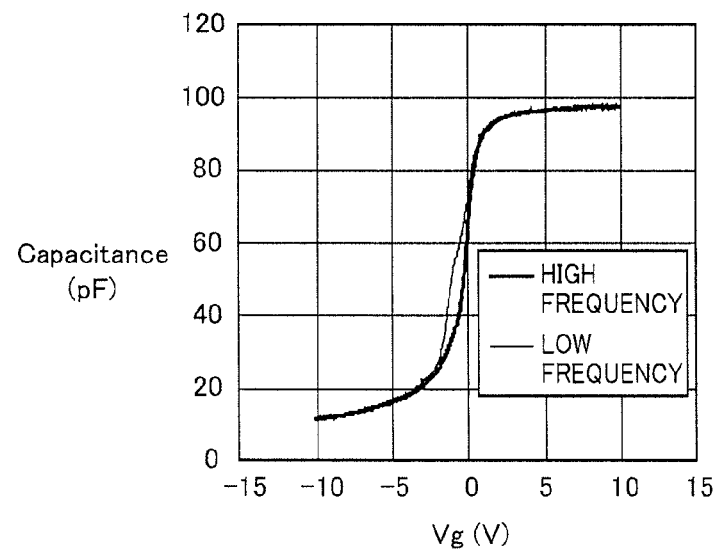
FIG. 36 is a graph showing a CV characteristic for a sample of an example A.

In the graph of each of FIG. 36-FIG. 38, the horizontal axis represents voltage and the vertical axis represents the capacitance. It should be noted that the capacitance represented by the vertical axis is shown with the entire capacitance C being normalized by oxide film capacitance $C_{ox}$. As apparent from FIG. 36-FIG. 38, in the sample of example A of the present invention in FIG. 36, there was no large difference between the high frequency CV characteristic and the low frequency CV characteristic. In contrast, in each of the samples of comparative example A shown in FIG. 37 and reference example A shown in FIG. 38, there was a relatively large difference between the high frequency CV characteristic and the low frequency CV characteristic. This is presumably because influence of the capacitance (interface state capacitance) resulting from the interface states became larger in the samples of comparative example A and reference example A than that in the sample of the example.

Furthermore, FIG. 39 shows results of calculating the respective interface state densities of the samples of example A and comparative example A by means of the above-described High-Low method. In FIG. 39, the vertical axis represents the interface state density, whereas the horizontal axis represents a value of energy with the conduction band regarded as a reference.

As apparent from FIG. 39, the sample of example A (sample in which buffer layer 21, breakdown voltage holding layer 22, oxide film 26, and gate electrode 10 are formed on the (0-33-8) plane) has a lower interface state density in any energy level than that of the sample of comparative example A (sample in which buffer layer 21, breakdown voltage holding layer 22, oxide film 26, and gate electrode 10 are formed on the (03-38) plane). Further, also in an energy level lower than the conduction band by 0.1 eV, it can be determined that the interface state density of the sample of example A is smaller than $1\times10^{12}$ cm$^{-2}$eV$^{-1}$.

From this, it was confirmed that by employing the structure in which the semiconductor layer and the insulating film are formed particularly on the (0-33-8) plane that is a plane of the carbon plane side of the {03-38} plane, the interface state density in the semiconductor device can be reduced as compared with a case of employing a structure in which the semiconductor layer and the insulating film are formed on the (03-38) plane of the silicon plane side.

Figure 40:
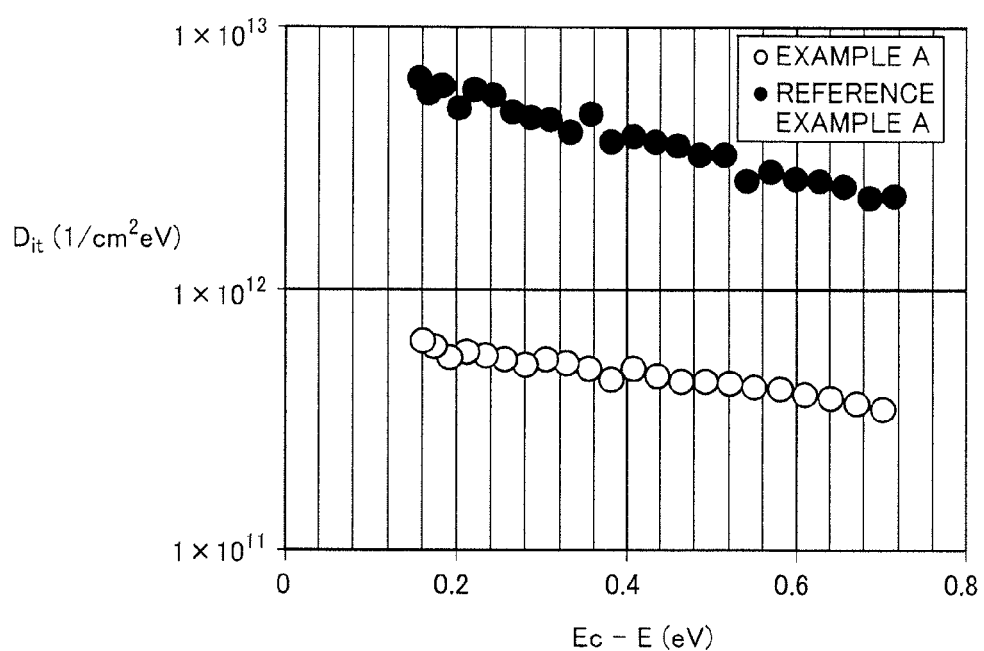
FIG. 40 is a graph showing a relation between an interface state density and energy with the conduction band regarded as a reference.

Likewise, the interface state density of the sample of reference example A was also calculated using the High-Low method (see FIG. 38), and was plotted in a graph of FIG. 40 together with the result of calculation for example A (see FIG. 36). Referring to FIG. 40, the sample of example A (sample from which the processing damage layer had been removed) had a lower interface state density in any energy level than that of the sample of reference example A (sample from which the processing damage layer had not been removed).

From this, it was confirmed that the interface state density in the semiconductor device can be reduced by removing the processing damage layer formed in the backside surface of the substrate.

Example 6

To confirm the effect of the present invention, a relation between interface state density and MOS channel mobility was evaluated in fabricated samples.

(As to Samples)

Semiconductor devices each having the structure shown in FIG. 1 were fabricated as samples in the following manner. That is, an epitaxial layer 3 having a thickness of 10 μm was formed on n type silicon carbide substrate 2 having a thickness of 400 μm. On epitaxial layer 3, a p type layer 4 having a thickness of 1 μm was formed. Next, phosphorus (P) was implanted thereinto as an impurity of n type conductivity for n$^+$ regions 5, 6. The impurity concentration was set at $1\times10^{20}$ cm$^{-3}$. Further, a gate length (channel length $L_g$), which was a distance between n$^+$ regions 5, 6, was set at 100 μm. Further, a gate width (channel width) was set at 200 μm.

Then, an oxide film was formed by means of dry oxidation treatment, and then nitrogen annealing was performed. In this way, a sample was fabricated. In the nitrogen annealing step, NO gas was used as the atmospheric gas, heating temperature was set at 1100° C., and heating time was set at 60 minutes. Another sample was also fabricated by forming the oxide film, then performing the nitrogen annealing, and then performing annealing treatment (argon annealing treatment) using argon gas, which was an inert gas, as atmosphere. The nitrogen annealing step was performed under conditions that NO gas was used as the atmospheric gas, heating temperature was set at 1100° C., and heating time was set at 120 minutes. In the argon annealing treatment, argon gas was used as the atmospheric gas, heating temperature was set at 1100° C., and heating time was set at 60 minutes. Here, the dry oxidation treatment for forming oxide film 8 was performed under common conditions that heating temperature was set at 1200° C. and heating time was set at 30 minutes. Still another sample was also fabricated which had not been through the nitrogen annealing step after the formation of the gate insulating film. It should be noted that in each of the samples, the oxide film thus formed had a thickness of 33-46 nm.

After the formation of the insulating film described above, as with the manufacturing method in the first embodiment of the present invention, as shown in FIG. 1, a source electrode 11 and a drain electrode 12 were formed. Then, a gate electrode 10 was formed on oxide film 8 serving as the gate insulating film. Each of source electrode 11 and drain electrode 12 was made of nickel (Ni) and had a thickness of 0.1 μm. Gate electrode 10 was made of aluminum (Al) and had a thickness of 1 μm.

(Measurement Method)

Next, channel mobility of each of the above-described samples of the semiconductor devices thus fabricated was measured. For the measurement method, the same method as that used in the experiment of example 1 was employed. Further, the interface state density was calculated in each of the samples using the same method as the method used in the experiment of example 5 (i.e., using the High-Low method based on data of the high frequency CV characteristic and the low frequency CV characteristic.

(Result of Measurement)

Figure 41:
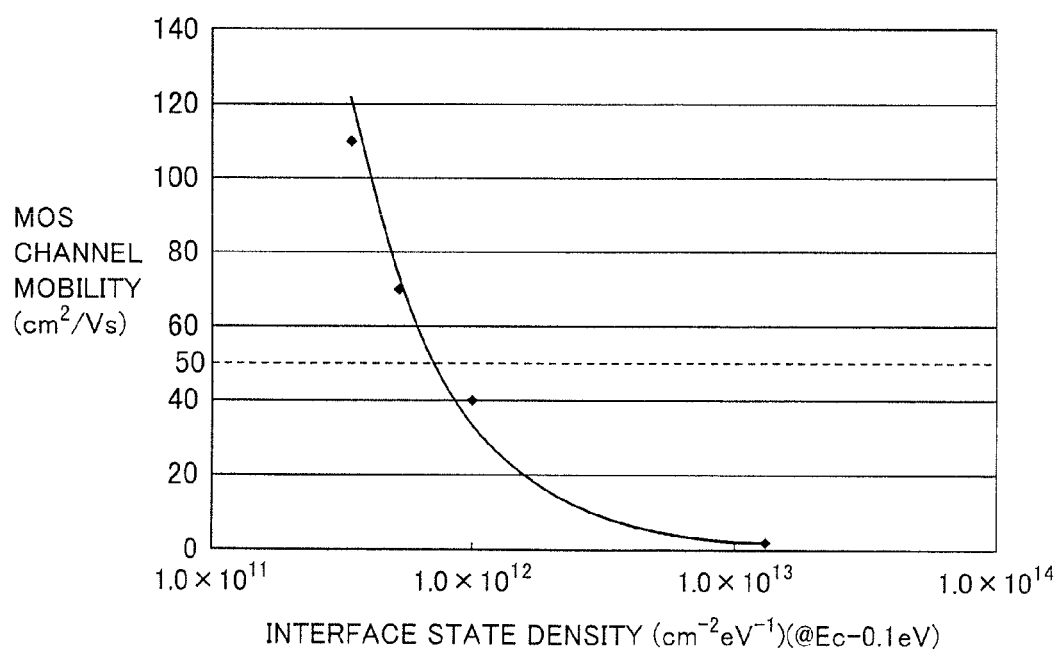
FIG. 41 is a graph showing a relation between an interface state density and a MOS channel mobility.

A result of the measurement was shown in FIG. 41. In FIG. 41, the horizontal axis represents a value of the interface state density in an energy level lower than the conduction band by 0.1 eV. On the other hand, in FIG. 41, the vertical axis represents the measured channel mobility (MOS channel mobility) of the semiconductor device.

As apparent from FIG. 41, as the interface state density is lower, the channel mobility is larger. Here, the minimally required value for the channel mobility to achieve a lower on-resistance than that of a conventional MOSFET which adopts silicon as its source material is considered to be approximately 50 cm$^2$/Vs as described above. In FIG. 41, it can be seen that a range of the interface state density allowing the channel mobility to be 50 cm$^2$/Vs is a range of $7\times10^{11}$ cm$^{-2}$eV$^{-1}$ or smaller. However, in view of a fact that a large error may be generally introduced into the measured value of the interface state density, it is considered that based on the experience of the inventors, sufficient channel mobility can be attained by setting the interface state density (in the level lower than the conduction band by 0.1 eV) to be smaller than $1\times10^{12}$ cm$^{-2}$eV$^{-1}$.

Example 7

An experiment was conducted to inspect why the on-resistance of the semiconductor device was reduced by removing the processing damage layer from the backside surface of the substrate. The experiment was conducted in the following procedure.

First, an ingot (source material crystal) of 4H-SiC was sliced to obtain a substrate. This substrate was subjected to fused KOH etching to remove a processing damage layer formed, during the slicing, in a region including its main surface. The fused KOH etching was performed under conditions that temperature was set at 520° C. and time was set at 10 minutes. Next, the one main surface is polished. This polishing is performed by sequentially performing LAP (lapping), MP (mechanical polishing), and CMP (chemical mechanical polishing). Next, on the one main surface thus polished, an epitaxial growth layer was formed. Further, an oxide film was formed on the epitaxial growth layer by means of thermal oxidation. The thermal oxidation was performed under conditions of 1200° C. and 120 minutes (example B). On the other hand, for comparison, a sample (reference example B) was also fabricated which had the processing damage layer remaining in the backside surface because the fused KOH etching was not performed in the above-described procedure. Then, the substrate of each of the samples of example B and comparative example B was removed by polishing from the backside surface of the substrate (the main surface thereof opposite to the side at which the epitaxial growth layer was formed), and the epitaxial growth layer exposed accordingly was subjected to photoluminescence measurement under a room temperature. The measurement was performed in the following manner using He—Cd laser (wavelength of 325 nm) as excitation laser. That is, the laser was converged by a lens to irradiate the sample therewith. Then, photoluminescence generated from each of the samples was converged by the lens and then passed through a filter or the like to come into a spectrometer for wavelength dispersion. Then, photoluminescence spectrum was obtained using a CCD (Charge Coupled Device) or the like. The wavelength resolution thereof was 1 nm.

Figure 42:
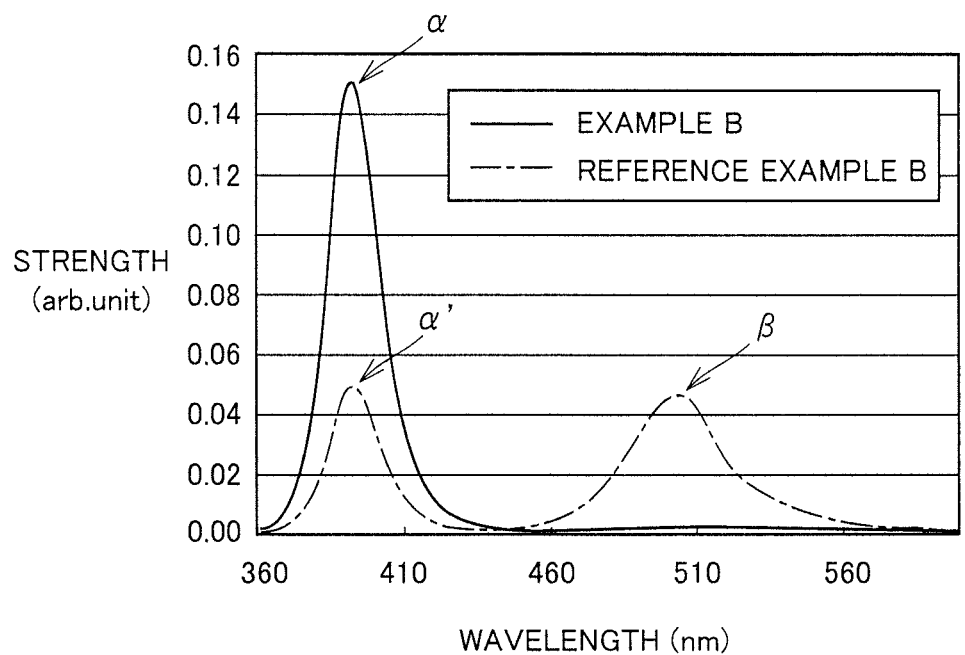
FIG. 42 shows a result of photoluminescence measurement under a room temperature.

FIG. 42 shows results of the photoluminescence measurement. In FIG. 42, the horizontal axis represents wavelength, whereas the vertical axis represents strength. As shown in FIG. 42, in the sample of example B, it can be seen that a peak appears in a wavelength of around 390 nm (peak a, which is a peak corresponding to interband luminescence). No peak is confirmed in a wavelength of around 500 nm. On the other hand, in the sample of reference example B, a peak (peak α') in the wavelength of around 390 nm has a strength reduced as compared with that in example B. Further, a distinctive peak (peak β) appears in the wavelength of around 500 nm. It can be concluded that stacking faults corresponding to the peak in around 500 nm cause increase of the on-resistance and the interface state density in the semiconductor device, based on the above-described result and the inventors' experiment result that on-resistance and interface state density in a semiconductor device can be reduced by decreasing a ratio of peak strength in the wavelength of around 500 nm to peak strength in the wavelength of around 390 nm (by decreasing the ratio to not more than 0.1, preferably, not more than 0.01). It was confirmed that by decreasing the ratio (to not more than 0.1, preferably, not more than 0.01), the on-resistance and the interface state density can be reduced in the semiconductor device.

It should be noted that the MOSFET has been illustrated in the above-described embodiments as one example of the semiconductor device of the present invention, but the semiconductor device of the present invention is not limited to this and may be a semiconductor device in another form, such as an IGBT (Insulated Gate Bipolar Transistor).

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

The semiconductor device and the method for manufacturing the semiconductor device in the present invention are particularly advantageously applicable to a semiconductor device, which is required to achieve improved channel mobility, as well as a method for manufacturing such a semiconductor device.

REFERENCE SIGNS LIST

1: semiconductor device; 2: substrate; 2A: main surface; 3: epitaxial layer; 4: p type layer; 5, 6: n$^+$ region; 7, 8: oxide film; 10: gate electrode; 11: source electrode; 12: drain electrode; 15: opening; 21: buffer layer; 22: breakdown voltage holding layer; 23: p region; 24: n$^+$ region; 25: p$^+$ region; 26: oxide film; 27: upper source electrode; 31: backside electrode; 41, 51: boundary region; 110: base layer (base substrate); 110A: main surface; 111: material substrate; 111A: main surface; 120: SiC layer (SiC substrate); 120A, 120B: main surface; 140: amorphous SiC layer; 150: ohmic contact layer; 160: carbon layer; 161: precursor layer; 181: first heater; 182: second heater.

The invention claimed is:

1. A semiconductor device comprising:
   a substrate made of silicon carbide and having a main surface having an off angle of not less than −3° and not more than +5° relative to a (0-33-8) plane in a <01-10> direction;
   a semiconductor layer made of silicon carbide and formed on said main surface of said substrate by means of epitaxial growth; and
   an insulating film formed in contact with a surface of said semiconductor layer,
   a maximum value of nitrogen atom concentration being $1\times10^{21}$ cm$^{-3}$ or greater in a region within 10 nm from an interface between said semiconductor layer and said insulating film,
   said semiconductor layer being made of silicon carbide of 4H type, and
   when photoluminescence measurement is performed for said semiconductor layer, a ratio of strength of a peak appearing in a wavelength of around 500 nm to strength of a peak appearing in a wavelength of around 390 nm being 0.1 or smaller.

2. The semiconductor device according to claim 1, wherein hydrogen atoms are contained in said region within 10 nm from the interface between said semiconductor layer and said insulating film.

3. The semiconductor device according to claim 1, wherein an interface state density is smaller than $1\times10^{12}$ cm$^{-2}$ eV$^{-1}$ in a level smaller than a conduction band by 0.1 eV.

4. A semiconductor device comprising:
   a substrate made of silicon carbide and having a main surface having an off angle of not less than −3° and not more than +5° relative to a (0-33-8) plane in a <01-10> direction;
   a semiconductor layer made of silicon carbide and formed on said main surface of said substrate by means of epitaxial growth; and
   an insulating film formed in contact with a surface of said semiconductor layer,
   a maximum value of hydrogen atom concentration being $1\times10^{21}$ cm$^{-3}$ or greater in a region within 10 nm from an interface between said semiconductor layer and said insulating film,
   said semiconductor layer being made of silicon carbide of 4H type, and
   when photoluminescence measurement is performed for said semiconductor layer, a ratio of strength of a peak appearing in a wavelength of around 500 nm to strength of a peak appearing in a wavelength of around 390 nm being 0.1 or smaller.

5. The semiconductor device according to claim 4, wherein nitrogen atoms are contained in said region within 10 nm from the interface between said semiconductor layer and said insulating film.

6. A semiconductor device comprising:
a substrate made of silicon carbide and having a main surface having an off angle of not less than −3° and not more than +5° relative to a (0-33-8) plane in a <01-10> direction;
a semiconductor layer made of silicon carbide and formed on said main surface of said substrate by means of epitaxial growth; and
an insulating film formed in contact with a surface of said semiconductor layer,
a maximum value of total concentration of nitrogen atoms and hydrogen atoms being $1 \times 10^{21}$ cm$^{-3}$ or greater in a region within 10 nm from an interface between said semiconductor layer and said insulating film,
said semiconductor layer being made of silicon carbide of 4H type, and
when photoluminescence measurement is performed for said semiconductor layer, a ratio of strength of a peak appearing in a wavelength of around 500 nm to strength of a peak appearing in a wavelength of around 390 nm being 0.1 or smaller.

7. A method for manufacturing a semiconductor device comprising the steps of:
preparing a substrate made of silicon carbide and having a main surface having an off angle of not less than −3° and not more than +5° relative to a (0-33-8) plane in a <01-10> direction;
forming a semiconductor layer on said main surface of said substrate by means of epitaxial growth;
forming an insulating film in contact with a surface of said semiconductor layer; and
adjusting nitrogen atom concentration such that a maximum value of the nitrogen atom concentration becomes $1 \times 10^{21}$ cm$^{-3}$ or greater in a region within 10 nm from an interface between said semiconductor layer and said insulating film,
the step of preparing said substrate including the steps of
obtaining said substrate from a source material crystal made of silicon carbide of 4H type, and
removing a processing damage layer formed in a region including the other main surface of said substrate thus obtained, the other main surface being opposite to said main surface of said substrate.

8. The method for manufacturing the semiconductor device according to claim 7, further comprising the step of providing hydrogen atoms in said region within 10 nm from the interface between said semiconductor layer and said insulating film.

9. The method for manufacturing the semiconductor device according to claim 8, wherein the step of providing said hydrogen atoms includes the step of heating said substrate having said insulating film formed thereon, using gas containing hydrogen atoms as atmospheric gas.

10. The method for manufacturing the semiconductor device according to claim 9, wherein said gas containing hydrogen atoms is water vapor or water vapor-containing oxygen.

11. The method for manufacturing the semiconductor device according to claim 7, wherein the step of adjusting said nitrogen atom concentration includes the step of heating said substrate having said insulating film formed thereon, using gas containing nitrogen atoms as atmospheric gas.

12. The method for manufacturing the semiconductor device according to claim 11, wherein the step of adjusting said nitrogen atom concentration includes the step of heating said substrate using an inert gas as the atmospheric gas after the step of heating using said gas containing nitrogen atoms as the atmospheric gas.

13. The method for manufacturing the semiconductor device according to claim 7, wherein:
in the step of obtaining said substrate, said substrate is obtained by slicing said source material crystal, and
in the step of removing said processing damage layer, said processing damage layer formed in said substrate by slicing said source material crystal is removed.

14. The method for manufacturing the semiconductor device according to claim 7, wherein in the step of removing said processing damage layer, said processing damage layer is removed by means of fused KOH etching.

15. The method for manufacturing the semiconductor device according to claim 7, wherein in the step of removing said processing damage layer, said processing damage layer is removed by means of dry etching.

16. The method for manufacturing the semiconductor device according to claim 7, wherein in the step of removing said processing damage layer, said processing damage layer is removed by means of thermal etching.

17. The method for manufacturing the semiconductor device according to claim 7, wherein in the step of removing said processing damage layer, said processing damage layer is removed by means of polishing.

18. A method for manufacturing a semiconductor device comprising the steps of:
preparing a substrate made of silicon carbide and having a main surface having an off angle of not less than −3° and not more than +5° relative to a (0-33-8) plane in a <01-10> direction;
forming a semiconductor layer on said main surface of said substrate by means of epitaxial growth;
forming an insulating film in contact with a surface of said semiconductor layer; and
adjusting hydrogen atom concentration such that a maximum value of the hydrogen atom concentration becomes $1 \times 10^{21}$ cm$^{-3}$ or greater in a region within 10 nm from an interface between said semiconductor layer and said insulating film,
the step of preparing said substrate including the steps of
obtaining said substrate from a source material crystal made of silicon carbide of 4H type, and
removing a processing damage layer formed in a region including the other main surface of said substrate thus obtained, the other main surface being opposite to said main surface of said substrate.

19. The method for manufacturing the semiconductor device according to claim 18, further comprising the step of providing nitrogen atoms in said region within 10 nm from the interface between said semiconductor layer and said insulating film.

20. A method for manufacturing a semiconductor device comprising the steps of:
preparing a substrate made of silicon carbide and having a main surface having an off angle of not less than −3° and not more than +5° relative to a (0-33-8) plane in a <01-10> direction;
forming a semiconductor layer on said main surface of said substrate by means of epitaxial growth;
forming an insulating film in contact with a surface of said semiconductor layer; and
adjusting total concentration of nitrogen atoms and hydrogen atoms such that a maximum value of said total concentration becomes $1 \times 10^{21}$ cm$^{-3}$ or greater in a region within 10 nm from an interface between said semiconductor layer and said insulating film, the step of preparing said substrate including the steps of obtaining said substrate from a source material crystal made of silicon carbide of 4H type, and removing a processing damage layer formed in a region including the other main surface of said substrate thus obtained, the other main surface being opposite to said main surface of said substrate.

* * * * *